United States Patent
Mao et al.

(10) Patent No.: US 9,454,190 B2
(45) Date of Patent: Sep. 27, 2016

(54) FIXING MECHANISM AND ELECTRONIC DEVICE CAPABLE OF ASSEMBLING AND DISASSEMBLING AN EXPANSION CARD MODULE

(71) Applicant: Wistron Corporation, New Taipei (TW)

(72) Inventors: Zhong-hui Mao, New Taipei (TW); Peng-Cheng Zhang, New Taipei (TW); Yu Chen, New Taipei (TW); Zhi-Peng Zou, New Taipei (TW); Shan-Gen Du, New Taipei (TW)

(73) Assignee: Wistron Corporation, New Taipei (TW)

( * ) Notice: Subject to any disclaimer, the term of this patent is extended or adjusted under 35 U.S.C. 154(b) by 80 days.

(21) Appl. No.: 14/589,968

(22) Filed: Jan. 5, 2015

(65) Prior Publication Data
US 2016/0018859 A1    Jan. 21, 2016

(30) Foreign Application Priority Data
Jul. 16, 2014 (CN) .......................... 2014 1 0338611

(51) Int. Cl.
*G06F 1/18* (2006.01)
*H05K 7/14* (2006.01)

(52) U.S. Cl.
CPC ............. *G06F 1/185* (2013.01); *H05K 7/1405* (2013.01); *H05K 7/1487* (2013.01)

(58) Field of Classification Search
CPC .... G06F 1/185; G06F 11/3031; G06F 1/186; H05K 7/1487; H05K 7/1405; H05K 7/1429
See application file for complete search history.

(56) References Cited

U.S. PATENT DOCUMENTS

| | | | | |
|---|---|---|---|---|
| 5,151,041 A * | 9/1992 | Kaiser | .................. | H05K 7/1405 439/157 |
| 5,434,752 A * | 7/1995 | Huth | ...................... | H01R 27/00 361/212 |
| 5,601,349 A * | 2/1997 | Holt | ........................ | G06F 1/184 174/67 |
| 6,069,796 A * | 5/2000 | Hastings | ................. | G06F 1/184 211/41.17 |
| 6,160,712 A * | 12/2000 | Itai | .......................... | G06F 1/184 24/563 |
| 6,185,104 B1 * | 2/2001 | Obermaier | ............. | G06F 1/184 361/756 |
| 6,381,146 B1 * | 4/2002 | Sevier | .................. | H05K 7/1411 200/51 R |
| 6,494,729 B1 * | 12/2002 | Stathopoulos | ....... | H01R 13/701 439/160 |
| 6,561,826 B2 * | 5/2003 | Puri | ................... | H01R 13/6485 439/157 |
| 6,618,264 B2 * | 9/2003 | Megason | ............. | H05K 7/1405 200/336 |
| 6,693,802 B2 * | 2/2004 | Vier | ..................... | H05K 7/1429 361/752 |

(Continued)

FOREIGN PATENT DOCUMENTS

TW    I368472    7/2012
TW    M461193    9/2013

*Primary Examiner* — Xanthia C Cunningham
(74) *Attorney, Agent, or Firm* — Winston Hsu; Scott Margo

(57) ABSTRACT

A fixing mechanism which is capable of assembling an expansion card module includes a base, a latch and a resilient component. The expansion card module slidably inserts into the base. The latch pivots to an accommodating portion of the base to switch between a first position and a second position. The latch includes a pressing portion and a pushing portion connected with each other. The pressing portion presses a side of the expansion card module since the latch is switched to the first position. The pushing portion pushes an opposite side of the expansion card module since the latch is switched to the second position, so as to upwardly move the expansion card module relative to the base. The resilient component is located inside the accommodating portion to actuate the latch and drives the latch to stay at the second position.

28 Claims, 19 Drawing Sheets

(56) References Cited

U.S. PATENT DOCUMENTS

| | | | | |
|---|---|---|---|---|
| 6,884,096 B2* | 4/2005 | Centola | ............ | H01R 13/62933 361/798 |
| 6,950,313 B1* | 9/2005 | Shih | ..................... | H05K 7/1408 361/679.31 |
| 6,960,720 B2* | 11/2005 | Wen-Lung | .............. | G06F 1/186 174/17 R |
| 7,012,813 B2* | 3/2006 | Wang | ...................... | G06F 1/184 361/753 |
| 7,057,902 B2* | 6/2006 | Li | ......................... | G06F 1/184 361/759 |
| 7,254,040 B2* | 8/2007 | Barina | .................... | G06F 1/185 361/754 |
| 7,265,997 B2* | 9/2007 | Jing | ........................ | G06F 1/184 312/223.2 |
| 7,394,664 B1* | 7/2008 | Chang | .................... | G06F 1/186 361/797 |
| 7,561,440 B2* | 7/2009 | Dai | ...................... | H05K 7/1408 312/223.2 |
| 7,697,302 B2* | 4/2010 | Yan | ........................ | G06F 1/185 361/679.32 |
| 7,715,199 B2* | 5/2010 | Chou | ................... | H05K 7/1408 361/732 |
| 8,081,480 B2* | 12/2011 | Tsai | ....................... | G06F 1/185 361/732 |
| 8,411,461 B2* | 4/2013 | Zhou | ...................... | G06F 1/186 361/801 |
| 9,066,438 B2* | 6/2015 | Chen | ................... | H05K 7/1405 |
| 2008/0128570 A1* | 6/2008 | Chen | ...................... | G06F 1/186 248/220.21 |
| 2009/0296358 A1* | 12/2009 | Tsai | ........................ | G06F 1/185 361/759 |
| 2014/0146444 A1 | 5/2014 | Chen | | |
| 2014/0293568 A1 | 10/2014 | Fu | | |

* cited by examiner

FIXING MECHANISM AND ELECTRONIC DEVICE CAPABLE OF ASSEMBLING AND DISASSEMBLING AN EXPANSION CARD MODULE

BACKGROUND OF THE DISCLOSURE

1. Field of the Disclosure

The present disclosure relates to a fixing mechanism for fixing an expansion card module and a related electronic device with the foresaid fixing mechanism, and more particularly, to a fixing mechanism capable of assembling and disassembling the expansion card module and a related electronic device having the foresaid fixing mechanism.

2. Description of the Prior Art

With the advanced technology, the cloud server has properties of low energy consumption, high calculating efficiency, preferred expanding function and easy management and trends toward the popular development of the technical industry. The cloud server mostly utilizes the rack server, which can include a plurality of expansion card modules according to actual demand for functional expansion of the cloud server. The conventional rack server disposes the plurality of expansion card modules on the inner mainboard, and a golden finger of each expansion card module is connected with an inserting slot of the mainboard by engagement. However, the plurality of expansion card modules is disposed on the mainboard in a crowded arrangement, the expansion card module removed from the inserting slot may hit the adjacent expansion card modules by accidental fault since the expansion card module is assembled or disassembled. Further, the expansion card module of the conventional rack server is connected to a supporter, and the supporter is fixed on the housing bracket by a screw to stably dispose the expansion card module on the mainboard. The screw fixing method cannot be manually executed so that assembly/disassembly of the expansion card module has drawbacks of inconvenience and complicated operation.

SUMMARY OF THE DISCLOSURE

The present disclosure provides a fixing mechanism capable of assembling and disassembling the expansion card module and a related electronic device having the foresaid fixing mechanism for solving above drawbacks.

According to the claimed disclosure, a fixing mechanism capable of assembling and disassembling an expansion card module includes a base, a latch and a resilient component. The base includes a connecting portion, a sliding slot structure and an accommodating portion. The sliding slot structure is disposed on the connecting portion. The expansion card module is adapted to slidably move relative to the connecting portion by the sliding slot structure. The accommodating portion is disposed on an end of the connecting portion. The latch pivots inside the accommodating portion to rotatably switch between a first position and a second position. The latch includes a pressing portion and a pushing portion. The pressing portion is utilized to press a side of the expansion card module since the latch is switched to the first position. The pushing portion is bent from the pressing portion. The pushing portion is adapted to push an opposite side of the expansion card module since the latch is switched from the first position to the second position, so as to move the expansion card module relative to the sliding slot structure. The resilient component is located inside the accommodating portion to actuate the latch, and the resilient component drives the latch to rotate and to stay at the second position.

According to the claimed disclosure, the connecting portion includes a first surface and a second surface opposite to each other. The sliding slot structure is disposed on the first surface. The base further includes at least one hook disposed on the second surface, and the connecting portion is fixed on a bracket by the hook.

According to the claimed disclosure, the latch further includes a resilient portion. Two ends of the resilient portion are respectively connected to the pressing portion and the pushing portion in a resilient deformable manner.

According to the claimed disclosure, the latch further includes a contacting portion stretching from the pushing portion to contact against the resilient portion and to constrain deformation of the resilient portion.

According to the claimed disclosure, the latch further includes a clamping portion disposed on the pressing portion. The clamping portion inserts into a clamping slot on the expansion card module since the pressing portion presses the expansion card module.

According to the claimed disclosure, the resilient component is an elastic piece structure with a first end and a second end opposite to each other. The first end is located inside the accommodating portion, and the second end movably contacts against the pushing portion.

According to the claimed disclosure, the accommodating portion includes a pivoting hole, and the latch further includes an axle structure adjacent to the pushing portion. The fixing mechanism further includes a rotary shaft piercing through the pivoting hole and the axle structure.

According to the claimed disclosure, the rotary shaft includes a body and an engaging portion. The engaging portion is disposed on an end of the body and engaged with the pivoting hole, and a radial dimension of the engaging portion is greater than a radial dimension of the body.

According to the claimed disclosure, the latch further includes a handle disposed on an end of the pressing portion opposite to the pushing portion.

According to the claimed disclosure, a distance between the handle and the axle structure is greater than a distance between the pushing portion and the axle structure.

According to the claimed disclosure, the base further includes a sliding shaft disposed inside the accommodating portion, and the fixing mechanism further includes a sliding component movably disposed inside the accommodating portion. An axle hole structure is formed on the sliding component, and the sliding component is slidably disposed on the sliding shaft via the axle hole structure.

According to the claimed disclosure, a fixing hole is formed on the sliding component. The latch further includes an axle structure adjacent to the pushing portion and rotatably inserting into the fixing hole.

According to the claimed disclosure, the resilient component is a compressive spring disposed on the axle hole structure.

According to the claimed disclosure, the fixing mechanism further includes a covering component disposed on the base. Two ends of the resilient component respectively contact against the covering component and the sliding component.

According to the claimed disclosure, the fixing mechanism further includes a constraining shaft piercing through the base, the sliding component and the covering component.

According to the claimed disclosure, the constraining shaft includes a body and an engaging portion. The engaging portion is disposed on an end of the body and engaged with the base. A radial dimension of the engaging portion is greater than a radial dimension of the body.

According to the claimed disclosure, the latch further includes a bridging portion. Two ends of the bridging portion are respectively connected to the pushing portion and the pressing portion.

According to the claimed disclosure, the bridging portion includes two ribs stretching from the pressing portion. The pushing portion is a pillar structure disposed between the two ribs.

According to the claimed disclosure, the latch further includes a handle disposed on an end of the pressing portion opposite to the pushing portion.

According to the claimed disclosure, the latch further includes a rotatable fulcrum portion. A distance between the rotatable fulcrum portion and the axle structure is smaller than the rotatable fulcrum portion and the handle, and a distance between the rotatable fulcrum portion and the pushing portion is smaller than a distance between the rotatable fulcrum portion and the handle.

According to the claimed disclosure, the rotatable fulcrum portion is a corner protrusion formed between two surface structures connected with each other.

According to the claimed disclosure, the latch further includes a stopping surface structure connected with the rotatable fulcrum portion.

According to the claimed disclosure, the rotatable fulcrum portion contacts a contacting surface of the accommodating portion and the sliding component does not contact the contacting surface when the latch is switched to the first position.

According to the claimed disclosure, the stopping surface structure contacts a contacting surface of the accommodating portion since the latch is switched to the second position.

According to the claimed disclosure, an electronic device capable of assembling and disassembling an expansion card module includes a bracket, a circuit board and a fixing mechanism. The circuit board is disposed on a bottom of the bracket. The circuit board has an inserting slot, and the expansion card module inserts into the inserting slot to electrically connect to the circuit board. The fixing mechanism is disposed on the bracket for assembly and disassembly of the expansion card module. The fixing mechanism includes a base, a latch and a resilient component. The base includes a connecting portion, a sliding slot structure and an accommodating portion. The sliding slot structure is disposed on the connecting portion. The expansion card module is adapted to slidably move relative to the connecting portion by the sliding slot structure. The accommodating portion is disposed on an end of the connecting portion. The latch pivots inside the accommodating portion to rotatably switch between a first position and a second position. The latch includes a pressing portion and a pushing portion. The pressing portion is utilized to press a side of the expansion card module since the latch is switched to the first position. The pushing portion is bent from the pressing portion. The pushing portion is adapted to push an opposite side of the expansion card module since the latch is switched from the first position to the second position, so as to move the expansion card module relative to the sliding slot structure. The resilient component is located inside the accommodating portion to actuate the latch, and the resilient component drives the latch to rotate and to stay at the second position.

The present disclosure can utilize the elastic-piece resilient component to movably contact against the pushing portion, or utilize the resilient component with the compressive spring form to connect with the latch by the sliding component, so that the resilient component can directly or indirectly actuate the latch. The pressing portion of the latch can resiliently press the expansion card module to absorb vibration generated by the expansion card module effectively and to prevent the foresaid vibration from being transmitted to inner components of the electronic device. Comparing to the prior art, the fixing mechanism capable of easily assembling and disassembling the expansion card module and the electronic device having the foresaid fixing mechanism of the present disclosure has advantages of simple structure, easy assembly/disassembly and convenient operation.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
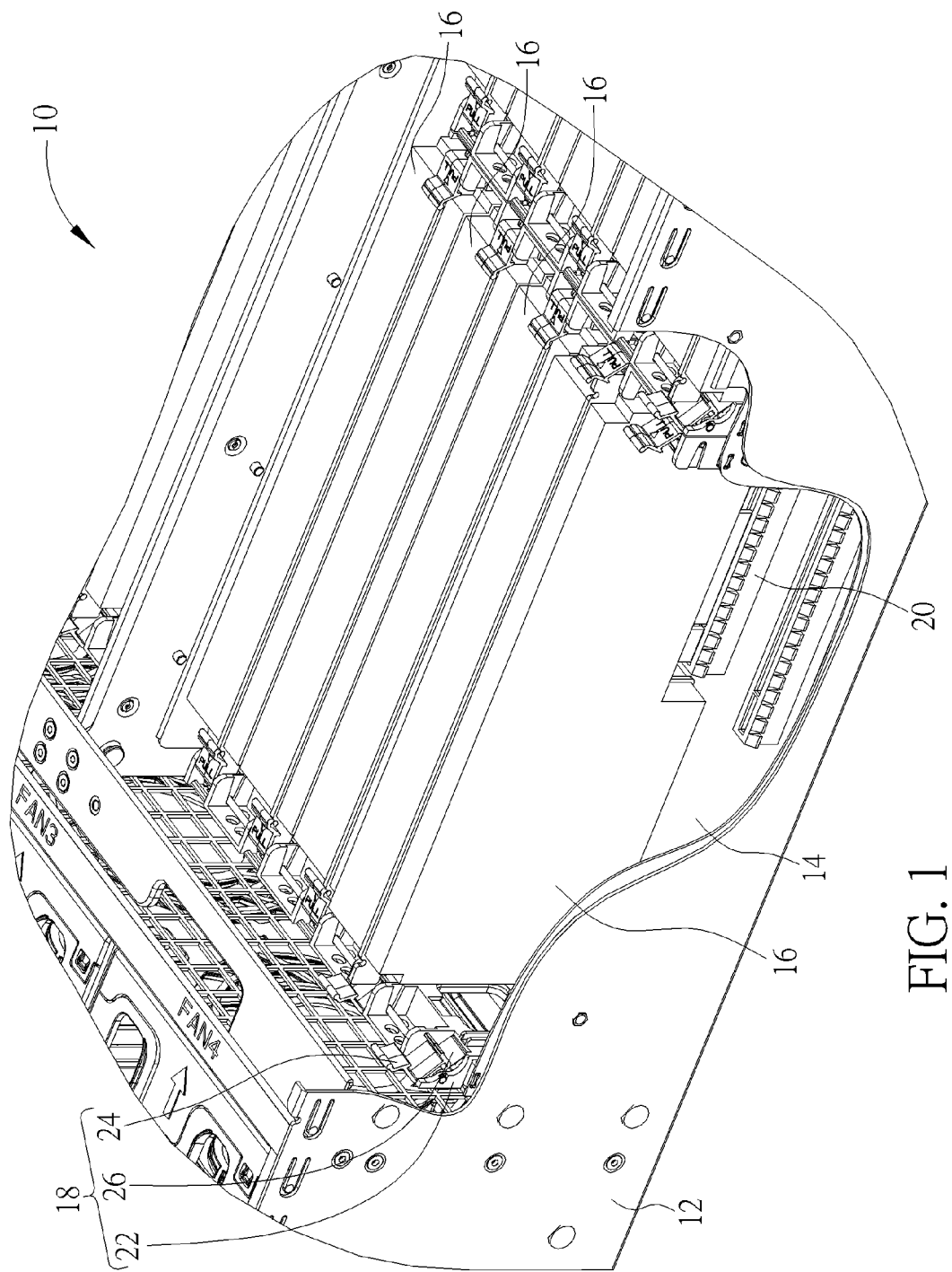
FIG. 1 is a diagram of an electronic device according to a first embodiment of the present disclosure.

Please refer to FIG. 1. FIG. 1 is a diagram of an electronic device 10 according to a first embodiment of the present disclosure. The electronic device 10 includes a bracket 12, a circuit board 14, an expansion card module 16 and a fixing mechanism 18. The circuit board 14 is disposed on a bottom of the bracket 12. The circuit board 14 includes at least one or more inserting slots 20. An amount of the expansion card module 16 can be one or more, and a golden finger (a connector) of each expansion card module 16 inserts into the corresponding inserting slot 20 to electrically connect with the circuit board 14. Besides, the fixing mechanism 18 is disposed inside the bracket 12. The fixing mechanism 18 fixes the expansion card module 16 on the circuit board 14 by engagement for effort-saving function, easy assembly/disassembly and convenient operation.

Figure 2:
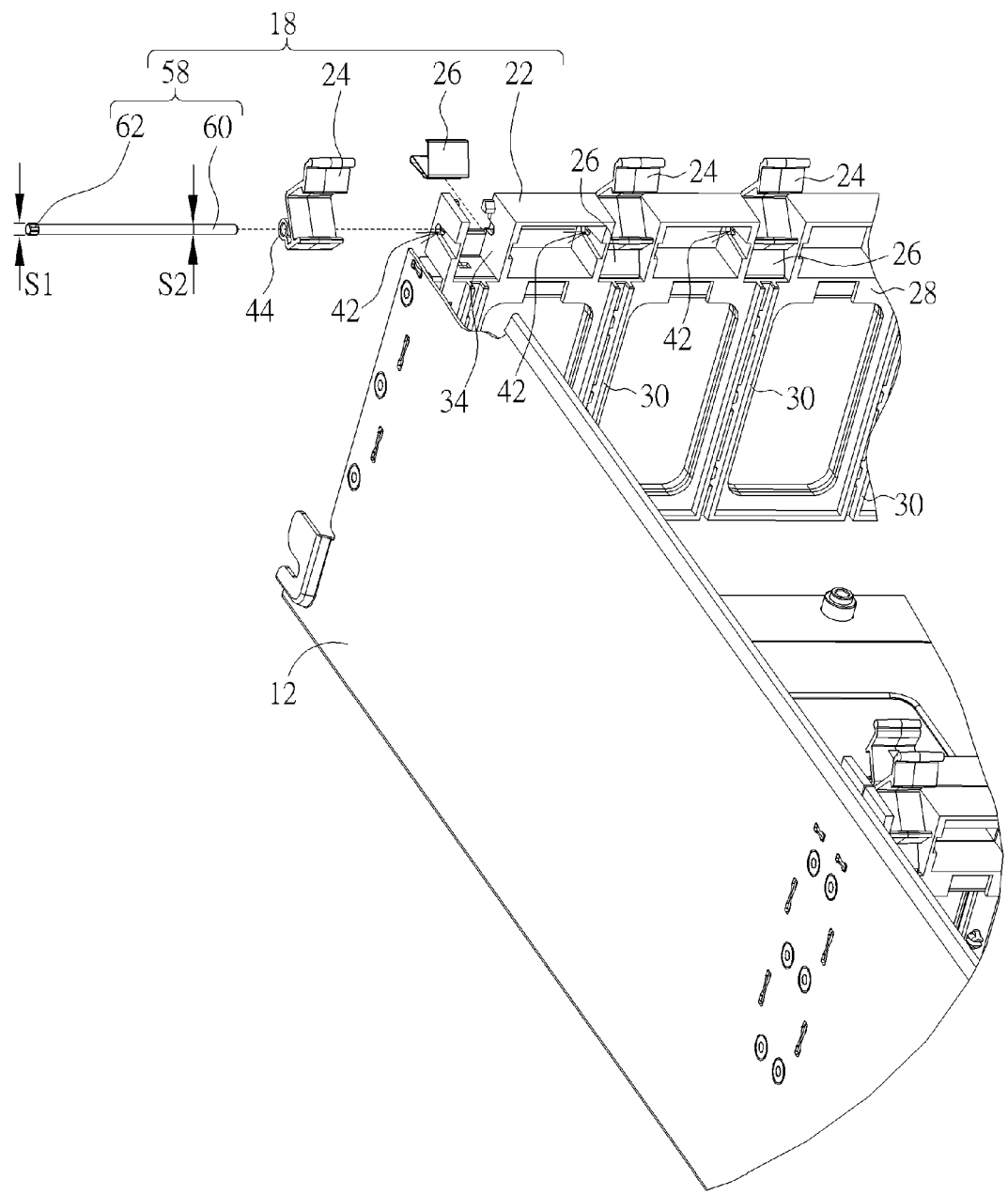
FIG. 2 is an exploded diagram of a fixing mechanism according to the first embodiment of the present disclosure.
Figure 3:
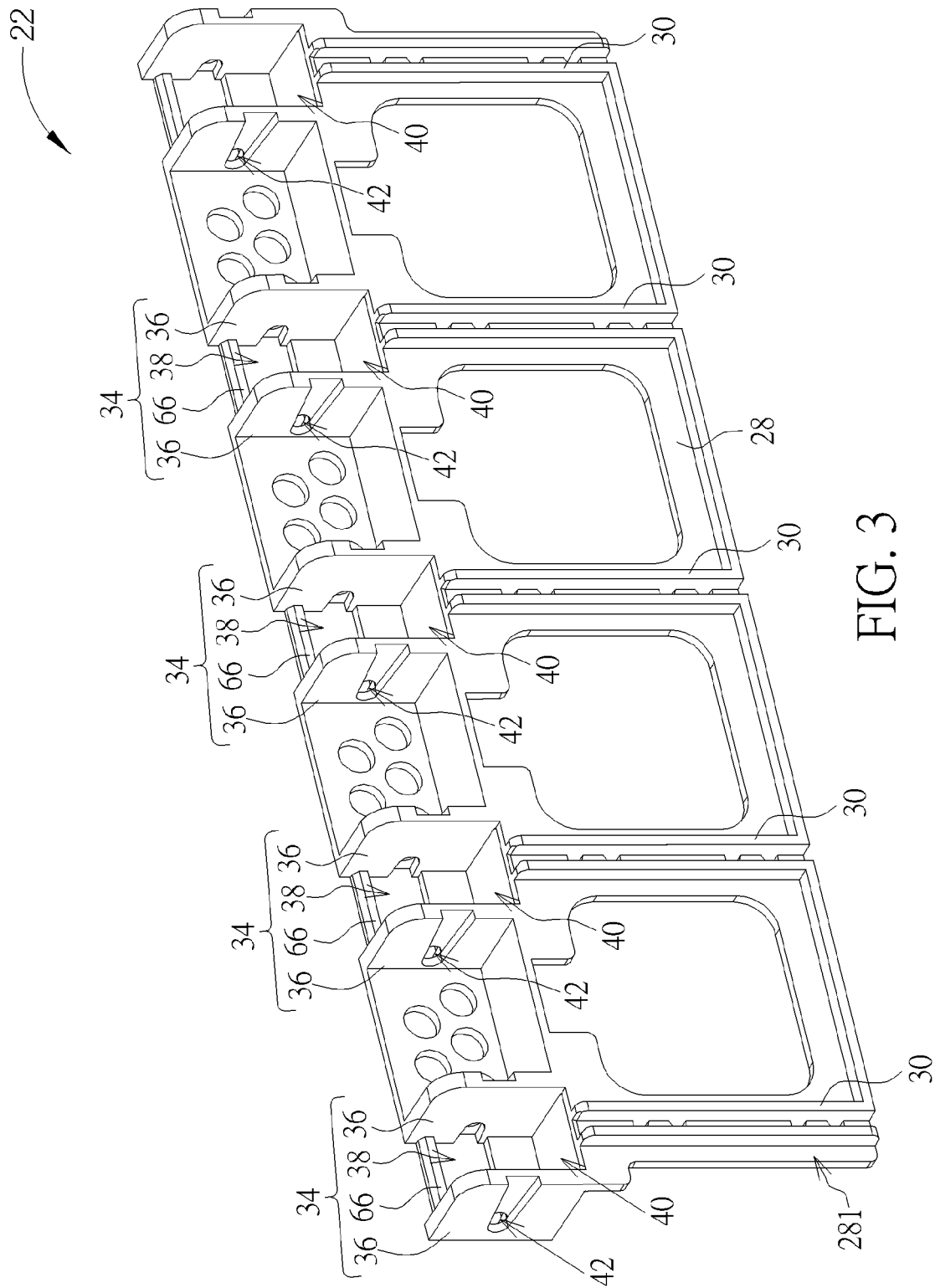
FIG. 3 and FIG. 4 respectively are diagrams of a base in different views according to the first embodiment of the present disclosure.
Figure 4:
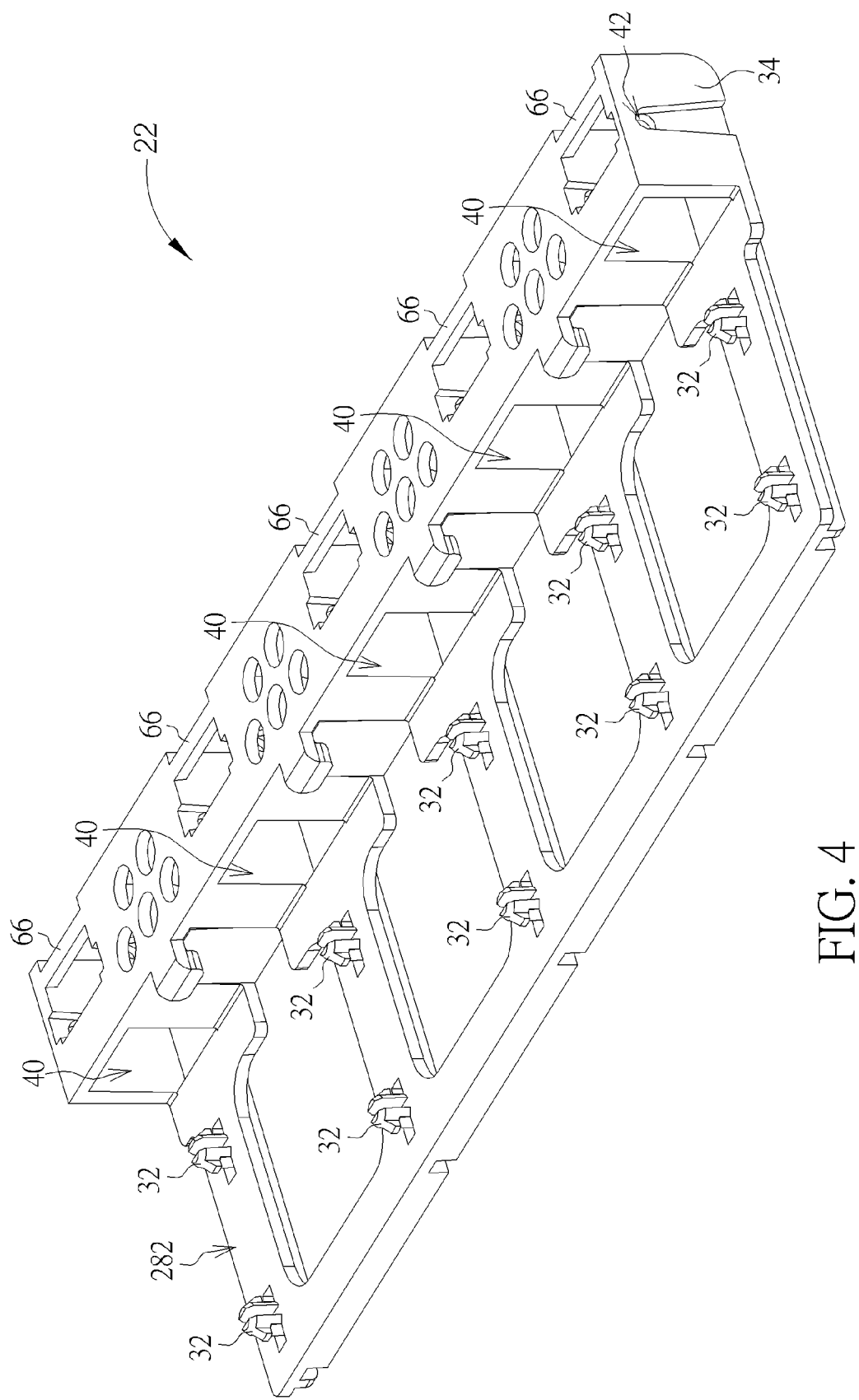
Figure 5:
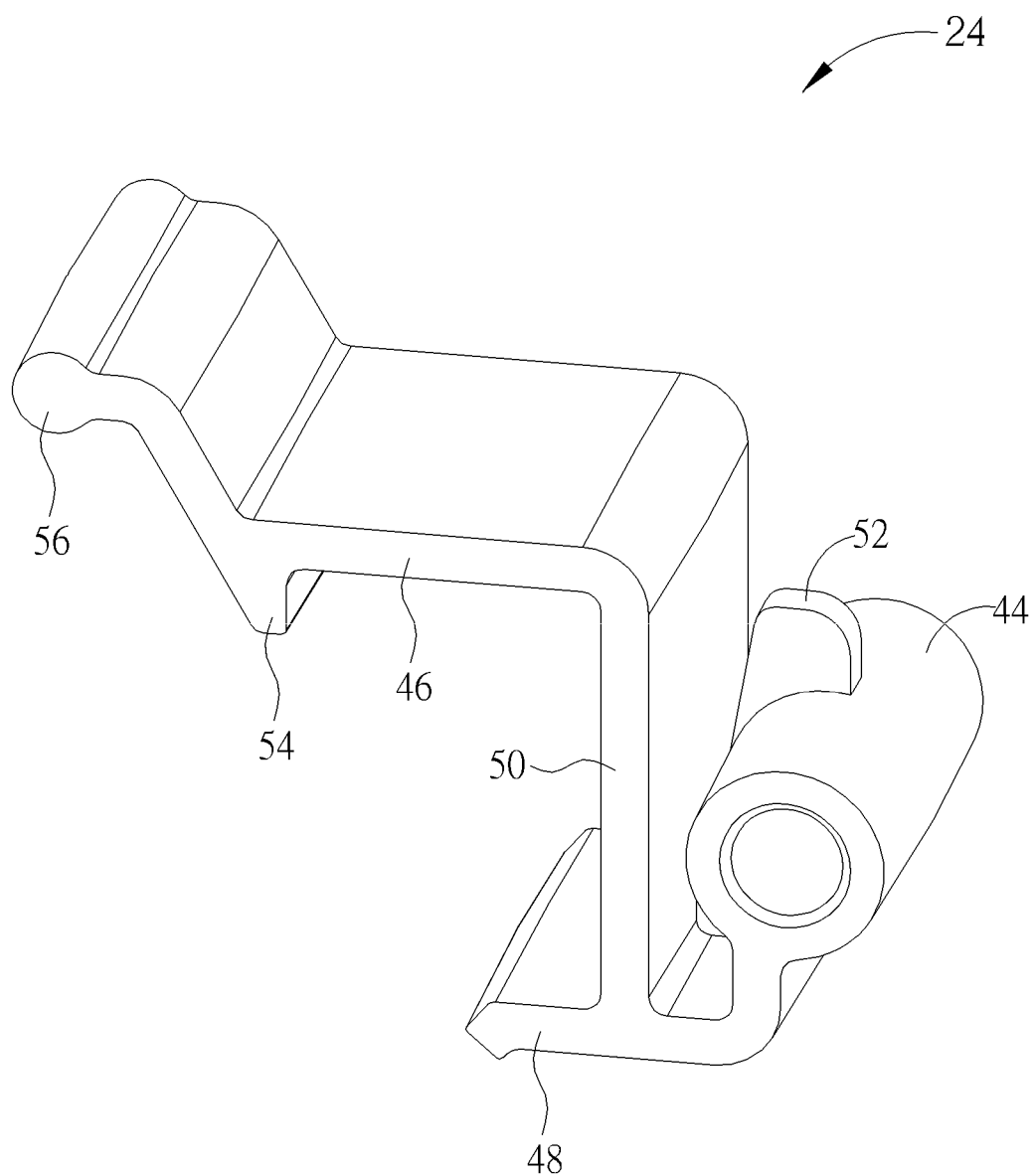
FIG. 5 is a diagram of a latch according to the first embodiment of the present disclosure.
Figure 6:
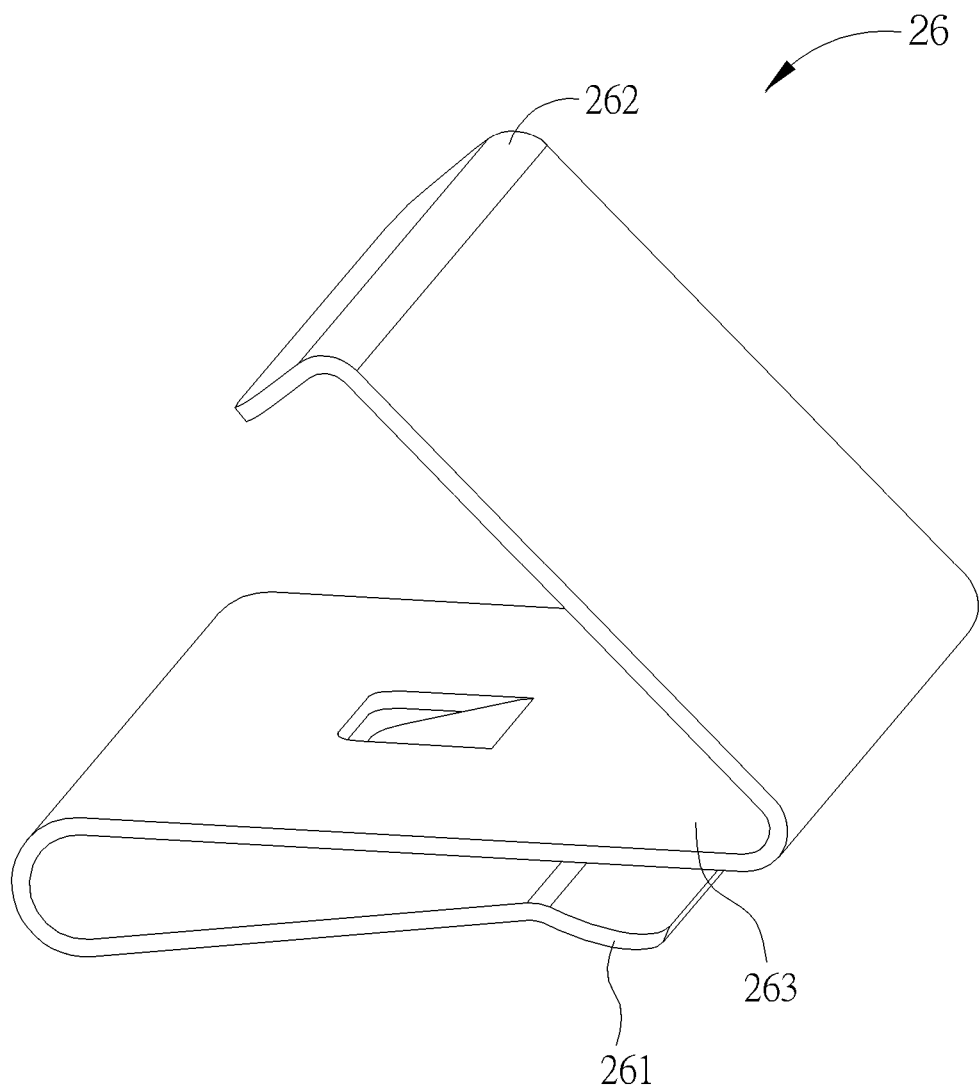
FIG. 6 is a diagram of a resilient component according to the first embodiment of the present disclosure.

Please refer to FIG. 1 to FIG. 6. FIG. 2 is an exploded diagram of the fixing mechanism 18 according to the first embodiment of the present disclosure. FIG. 3 and FIG. 4 respectively are diagrams of a base 22 in different views according to the first embodiment of the present disclosure. FIG. 5 is a diagram of a latch 24 according to the first embodiment of the present disclosure. FIG. 6 is a diagram of a resilient component 26 according to the first embodiment of the present disclosure. As shown in FIG. 2, the fixing mechanism 18 includes the base 22, the latch 24 and the resilient component 26. The latch 24 pivots to the base 22. A resilient recovering force of the resilient component 26 can drive the latch 24 to rotate relative to the base 22.

As shown in FIG. 3 and FIG. 4, the base 22 includes a connecting portion 28 disposed on a lateral wall of the bracket 12. The connecting portion 28 includes a first surface 281 and a second surface 282 opposite to each other. The base 22 further includes a sliding slot structure 30, a hook 32 and an accommodating portion 34. The sliding slot structure 30 is disposed on the first surface 281 of the connecting portion 28, and a lateral edge of the expansion card module 16 can move relative to the connecting portion 28 by the sliding slot structure 30. An amount of the hook 32 can be one or more. The hook 32 is disposed on the second surface 282 of the connecting portion 28. The connecting portion 28 is fixed on the bracket 12 via the hook 32. The accommodating portion 34 is located on an end of the connecting portion 28. The accommodating portion 34 includes two ribs 36. An accommodating space 38 is formed between the ribs 36, and a bottom of the accommodating space 38 can be an opening 40. The accommodating portion 34 further includes a pivoting hole 42 formed on one of the ribs 36.

As shown in FIG. 5, the latch 24 includes an axle structure 44, a pressing portion 46, a pushing portion 48, a resilient portion 50, a contacting portion 52, a clamping portion 54 and a handle 56. The axle structure 44 can be a hollow pillar adjacent to the pushing portion 48. The rotary shaft 58 of the fixing mechanism 18 pierces through the pivoting hole 42 and the axle structure 44, and the latch 24 can pivot relative to the accommodating portion 34. Two ends of the resilient portion 50 are respectively connected to the pressing portion 46 and the pushing portion 48 in a resilient deformable manner, which means the pushing portion 48 is bent from the pressing portion 46. The handle 56 is disposed on an end of the pressing portion 46 opposite to the pushing portion 48, and the clamping portion 54 is disposed on the foresaid end of the pressing portion 46 between the pressing portion 46 and the handle 56. The contacting portion 52 stretches from the pushing portion 48 and can partly overlap the axle structure 44. The resilient portion 50 is close to the contacting portion 52 and a gap is formed between the resilient portion 50 and the contacting portion 52. When an external force is applied to the handle 56, the resilient portion 50 is structurally deformed to move relative to the pressing portion 46 and/or the pushing portion 48, the contacting portion 52 is adapted to contact against the resilient portion 50 for deformation constraint of the resilient portion 50, to prevent the resilient portion 50 from being deformed over predetermined tolerance.

It should be mentioned that the rotary shaft 58 can include a body 60 and an engaging portion 62. The body 60 is a rod structure. The engaging portion 62 is a teeth structure disposed on an end of the body 60 (the rod structure). Shapes of the body 60 and the engaging portion 62 are not limited to the above-mentioned embodiment. A radial dimension S1 of the he engaging portion 62 is greater than a radial dimension S2 of the body 60, and aperture diameters of the pivoting hole 42 and the axle structure 44 are substantially equal to the radial dimension D2. Therefore, when the body 60 of the rotary shaft 58 pierces through the pivoting hole 42 and the axle structure 44, the latch 24 can freely rotate relative to the accommodating portion 34, and the engaging portion 62 can be engaged with the pivoting hole 42 to constrain an axial movement of the rotary shaft 58 relative to the accommodating portion 34.

As shown in FIG. 6, the resilient component 26 of the first embodiment is an elastic piece structure which is made of metal material or plastic material. The resilient component 26 includes a first end 261 and a second end 262 opposite to each other, and a bridging end 263 located between the first end 261 and the second end 262. The first end 261 and the bridging end 263 can be buckled on the bracket 12, and the second end 262 inserts into the accommodating space 38 of the accommodating portion 34 via the opening 40. Further, the first end 26 and the bridging end 263 can be buckled on the connecting portion 28 and the second end 262 is located inside the accommodating portion 34 in a resilient deformable manner. It is to say, the second end 262 is a suspended free end located inside the accommodating portion 34. With rotation of the latch 24 relative to the base 22, the second end 262 can movably contact against the pushing portion 48 of the latch 24 to provide the resilient recovering force.

Figure 7:
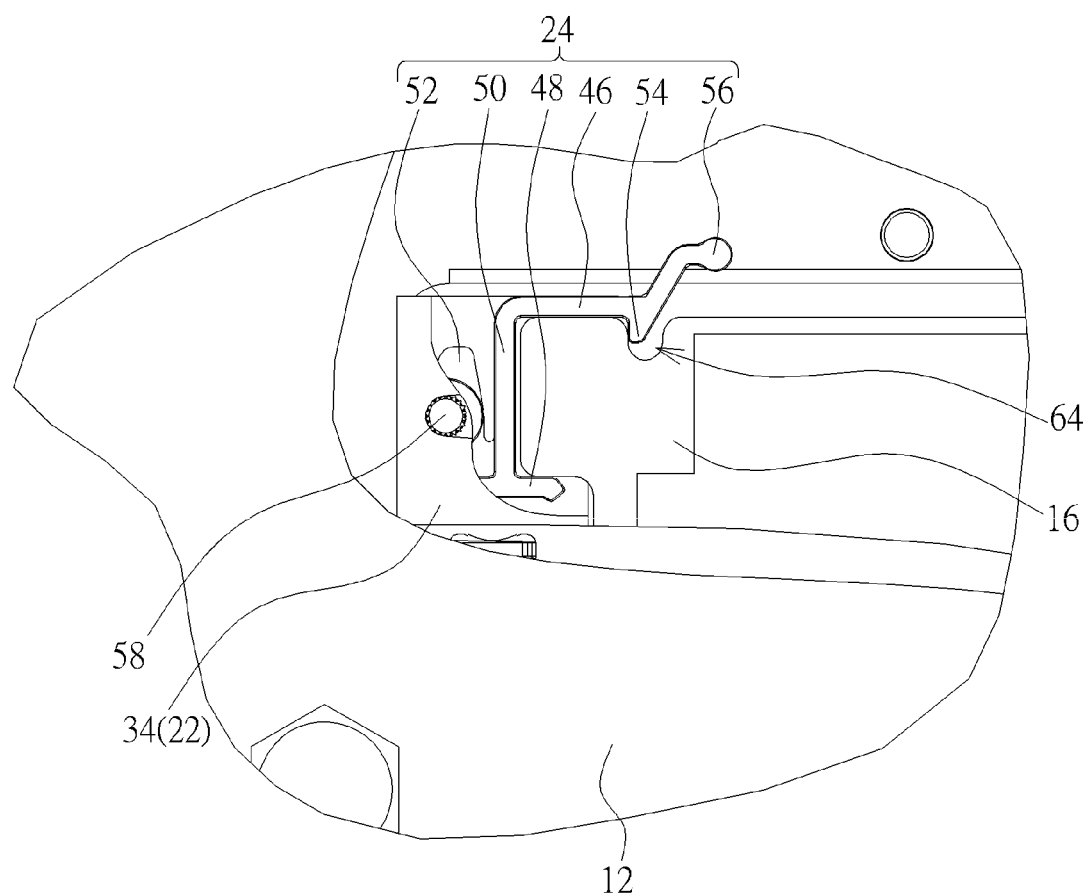
FIG. 7 to FIG. 9 respectively are diagrams of the fixing mechanism in different operation modes according to the first embodiment of the present disclosure.
Figure 8:
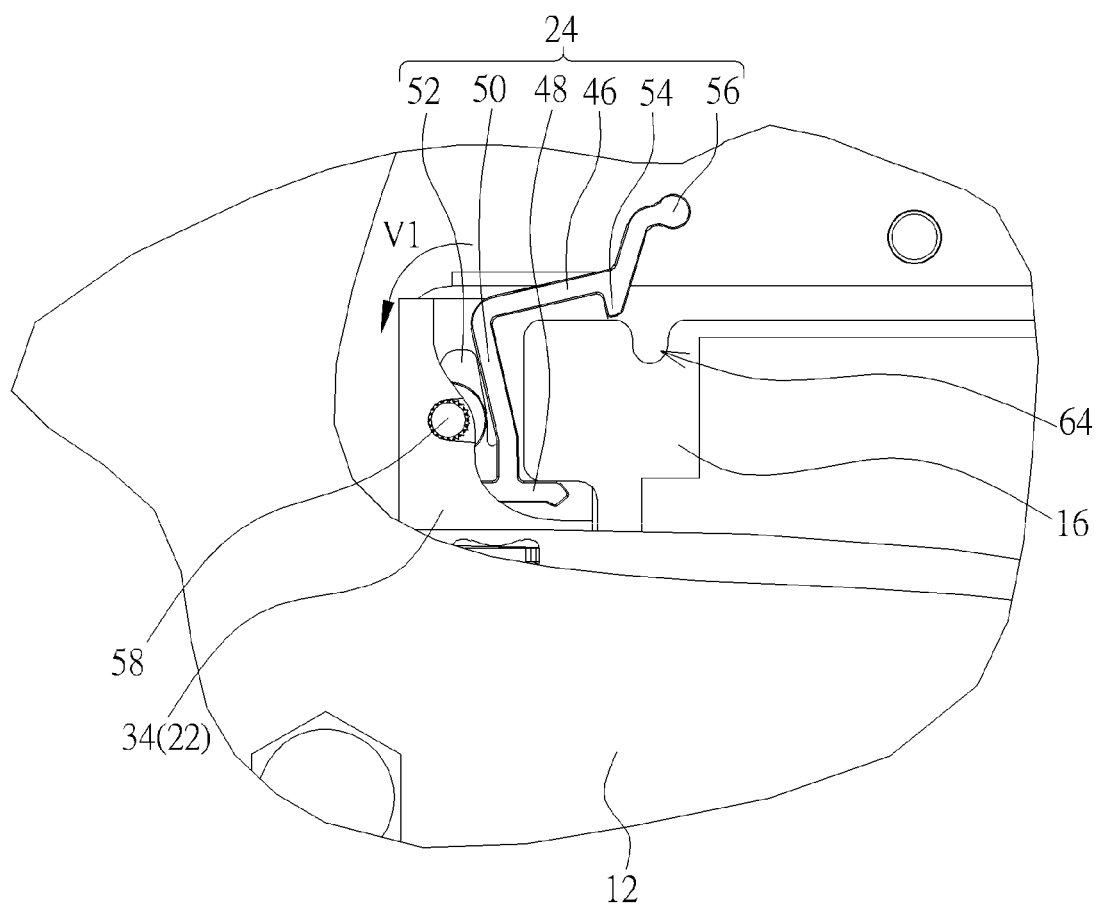
Figure 9:
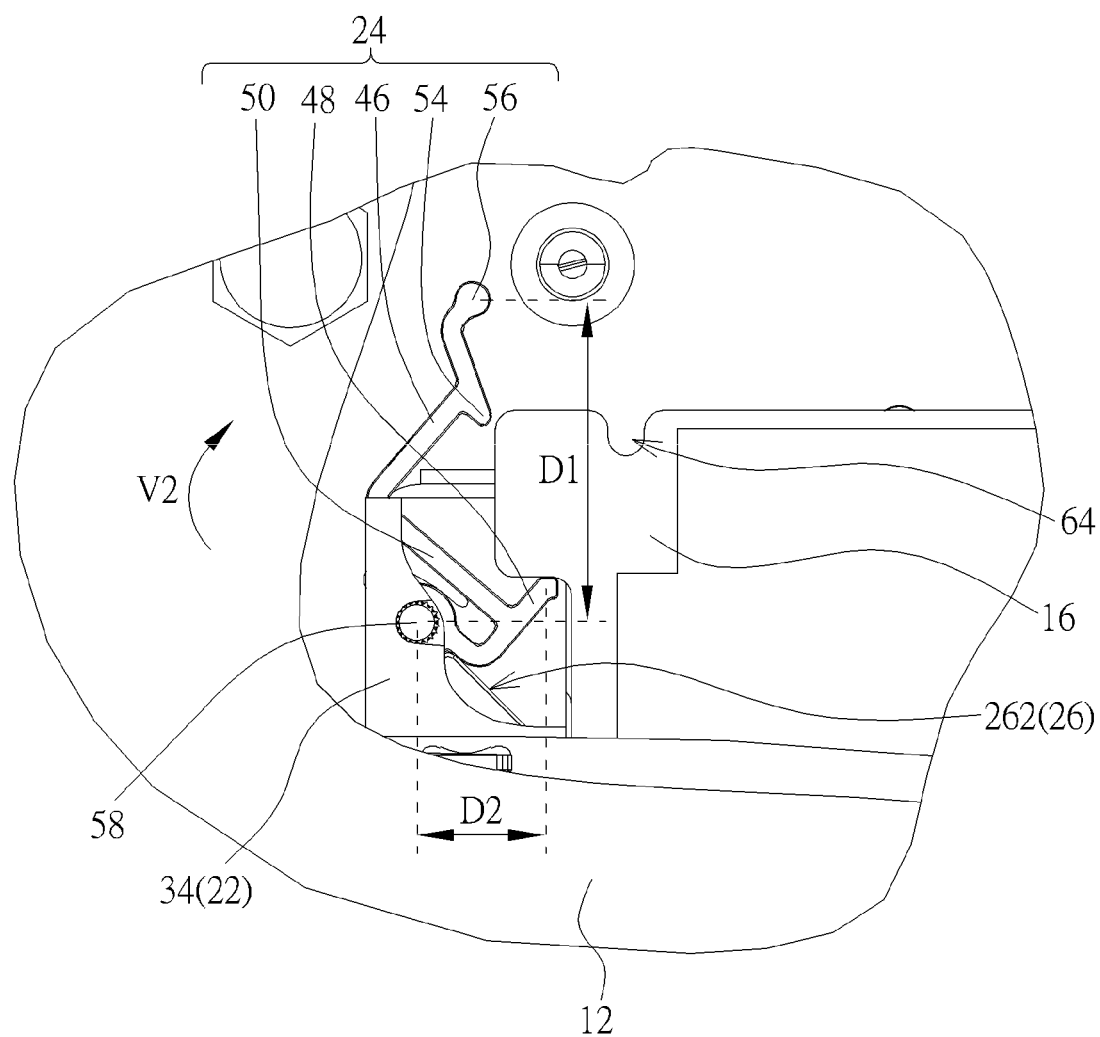

Please refer to FIG. 7 to FIG. 9. FIG. 7 to FIG. 9 respectively are diagrams of the fixing mechanism 18 in different operation modes according to the first embodiment of the present disclosure. The latch 24 can rotate relative to the accommodating portion 34 to switch between a first position and a second position. As shown in FIG. 7, the latch 24 is switched to the first position, the pressing portion 46 presses a side (an upper side) of the expansion card module 16, the clamping portion 54 inserts into the clamping slot 64 of the expansion card module16, and the pushing portion 48 contacts against an opposite side (a lower side) of the expansion card module 16. Due to assembly of the clamping portion 54 and the clamping slot 64, the latch 24 drives the pressing portion 46, the resilient portion 50 and the pushing portion 48 to respectively contact against the upper side, the lateral side and the lower side of the expansion card module 16, so as to stably assemble the expansion card module 16 with the circuit board 14 and to prevent the expansion card module 16 from being separated from the bracket 12.

As shown in FIG. 8, the external force is applied to the handle 56 of the latch 24 for disassembly of the expansion card module 16, and the pressing portion 46 is structurally deformed relative to the resilient portion 50 to separate the clamping portion 54 from the clamping slot 64. In the meantime, the latch 24 is switched from the first position to the second position, the pushing portion 48 upwardly pushes the opposite side (the lower side) of the expansion card module 16. The external force applied to the handle 56 can drive the resilient portion 50 to bend relative to the pushing portion 48 and to contact against the contacting portion 52, the latch 24 is driven to rotate at the counterclockwise direction V1. Because the pressing portion 46 does not block above the expansion card module 16, the pushing portion 48 can push the expansion card module 16 to upwardly move relative to the sliding slot structure 30 (as shown in FIG. 2), so that the user can manually remove the specific expansion card module 16 by switching the latch 24 to the second position without collision with the adjacent expansion card module 16.

As shown in FIG. 9, the latch 24 is switched to the second position, the resilient portion 50 of the latch 24 contacts against a constraining portion 66 of the base 22 (as shown in FIG. 3 and FIG. 4), and the latch 24 stops rotation. The pressing portion 46 and the clamping portion 54 are removed from the expansion card module 16, the expansion card module 16 is not constrained by the fixing mechanism 18, and the expansion card module 16 can be upwardly pulled for removal; meanwhile, the second end 262 of the resilient component 26 contacts against the pushing portion 48 to stay the latch 24 at the second position. The latch 24 does not move to the first position by its gravity force due to application of the resilient component 26. In addition, when the expansion card module 16 is assembled, the expansion card module 16 can move along the sliding slot structure 30 downwardly to press the pushing portion 48. A front end (the free end) of the pushing portion 48 has an inclined surface, the lateral side of the expansion card module 16 contacts the inclined surface of the pushing portion 48 to increase contact area between the expansion card module 16 and the pushing portion 48. The latch 24 is driven to rotate at the clockwise direction V2, as position shown in FIG. 9 varied toward position shown in FIG. 8. Then, the handle 56 is manually manipulated to insert the clamping portion 54 into the clamping slot 64, so that the pressing portion 46 and the clamping portion 54 can be recovered to the first position shown in FIG. 7.

It should be mentioned that a distance D1 between the handle 56 and the axle structure 44 is preferably greater than a distance D2 between the pushing portion 48 and the axle structure 44. The external force applied to the handle 56 by the user can be smaller than lifting force of the expansion card module 16 (such as summation of weight of the expansion card module 16 and friction force between the expansion card module 16 and the inserting slot 20) for effort-saving function.

Figure 10:
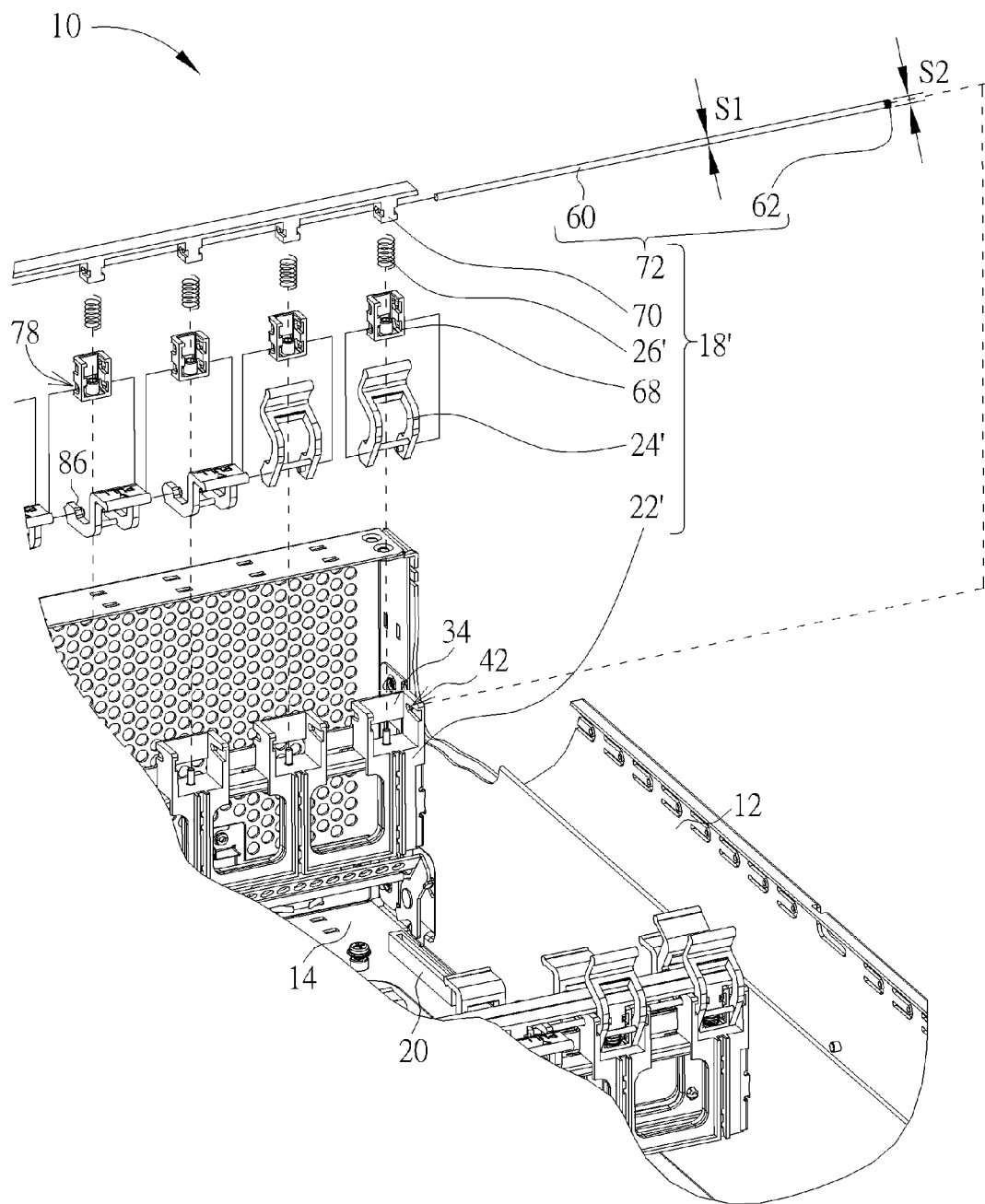
FIG. 10 is an exploded diagram of the electronic device according to a second embodiment of the present disclosure.
Figure 11:
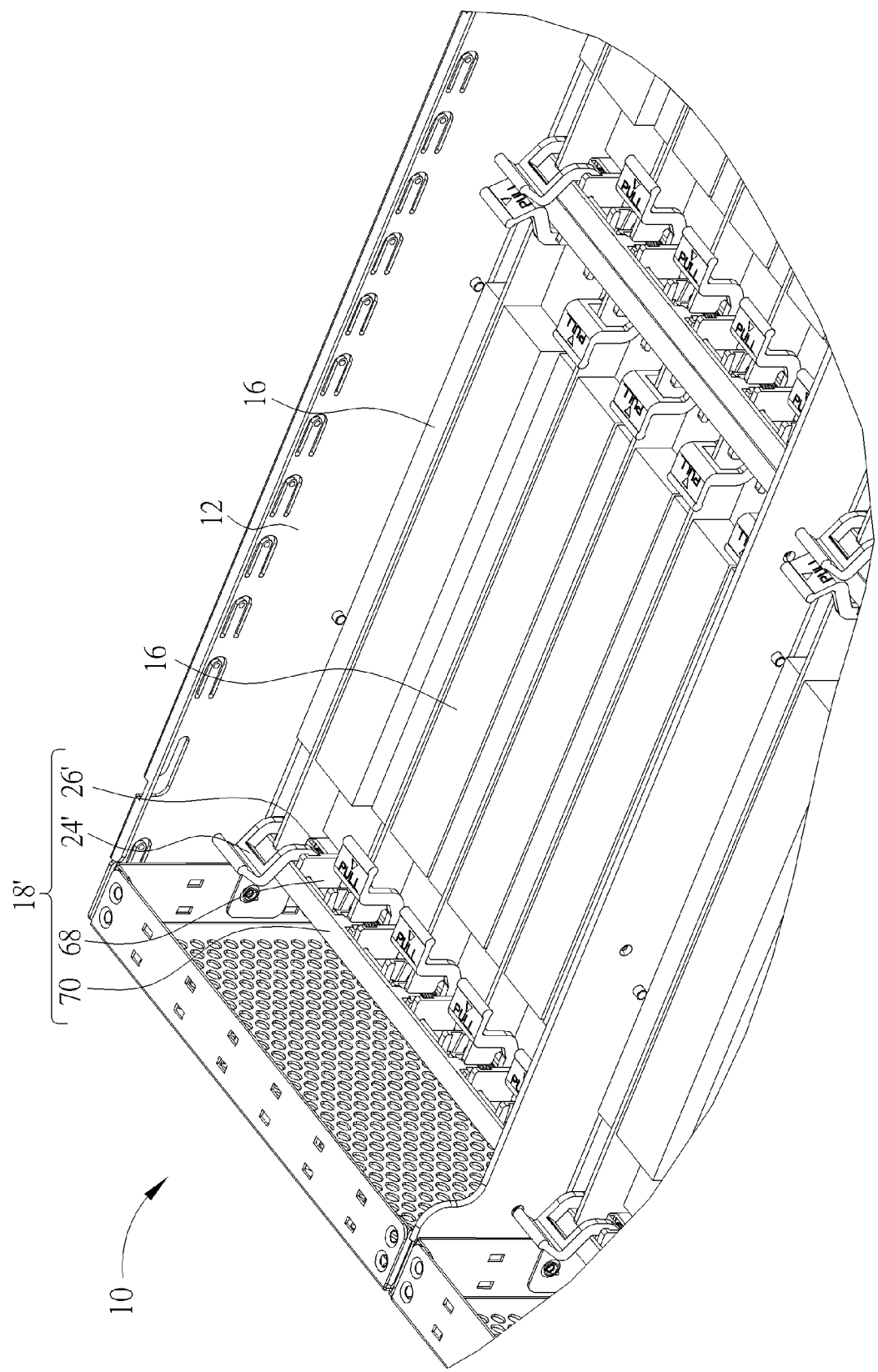
FIG. 11 is an assembly diagram of the electronic device according to the second embodiment of the present disclosure.

Please refer to FIG. 10 to FIG. 11. FIG. 10 is an exploded diagram of the electronic device 10 according to a second embodiment of the present disclosure. FIG. 11 is an assembly diagram of the electronic device 10 according to the second embodiment of the present disclosure. The electronic device 10 includes the bracket 12, the circuit board 14, the expansion card module 16 and the fixing mechanism 18'. In the second embodiment, elements having the same numeral as ones of the first embodiment have the same structures and functions, and a detailed description is omitted herein for simplicity. Difference between the first embodiment and the second embodiment is that the fixing mechanism 18' includes the base 22', the latch 24', the resilient component 26', a sliding component 68, a covering component 70 and a constraining shaft 72. The constraining shaft 72 is utilized to constrain relative movement between the base 22', the sliding component 68 and the covering component 70. The resilient component 26' is disposed between the sliding component 68 and the covering component 70. The latch 24' pivots to the sliding component 68 and is movably disposed inside the accommodating portion 34 of the base 22'.

Figure 12:
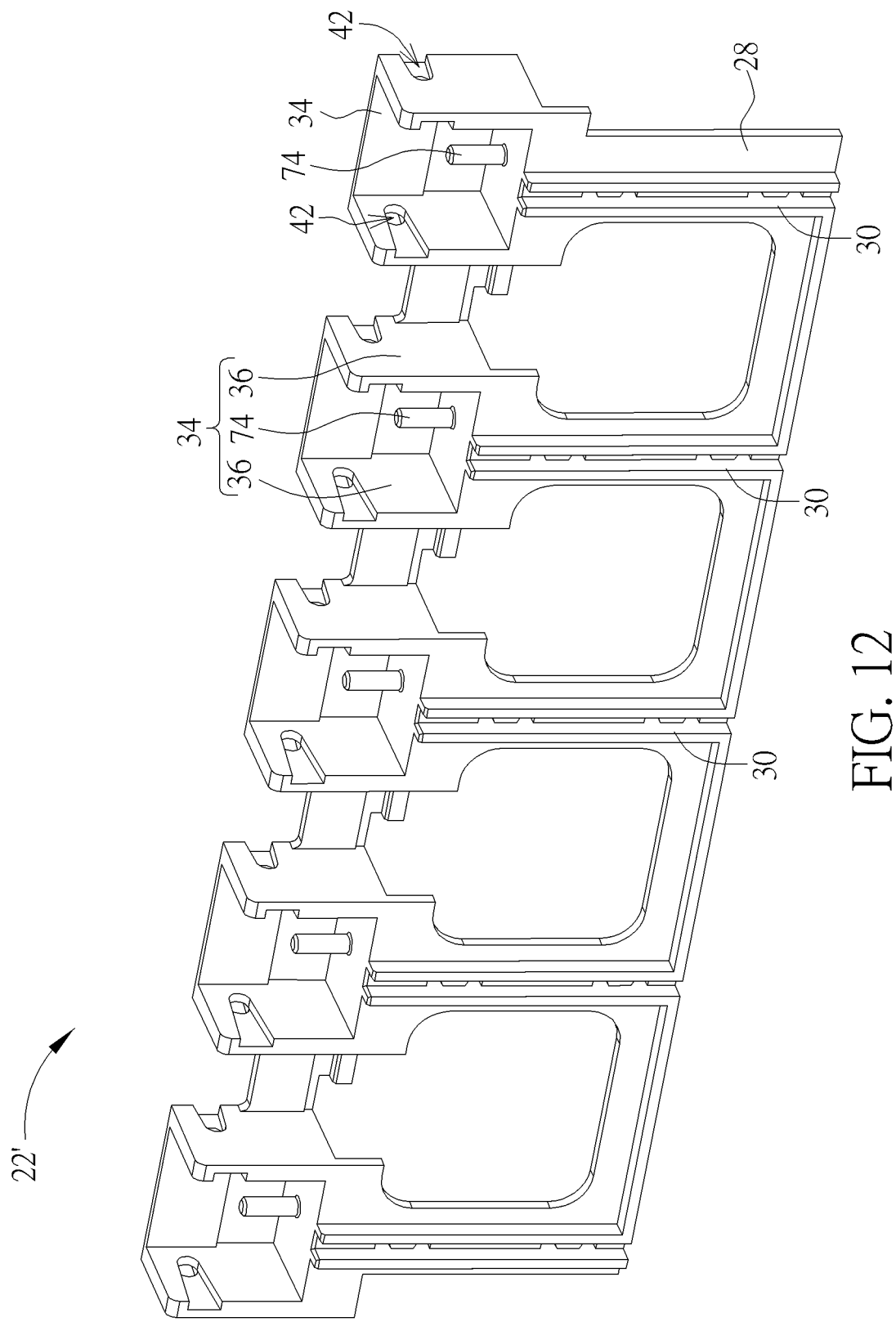
FIG. 12 is a diagram of the base according to the second embodiment of the present disclosure.
Figure 13:
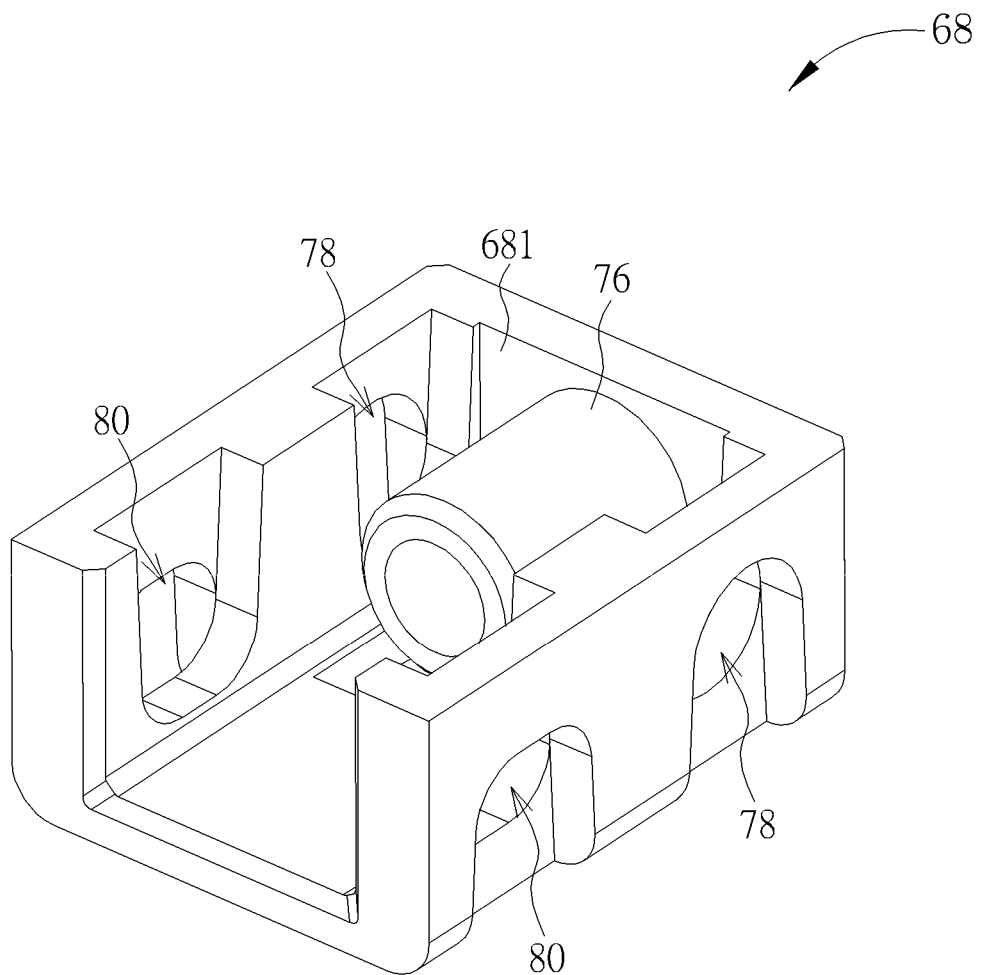
FIG. 13 is a diagram of a sliding component according to the second embodiment of the present disclosure.
Figure 14:
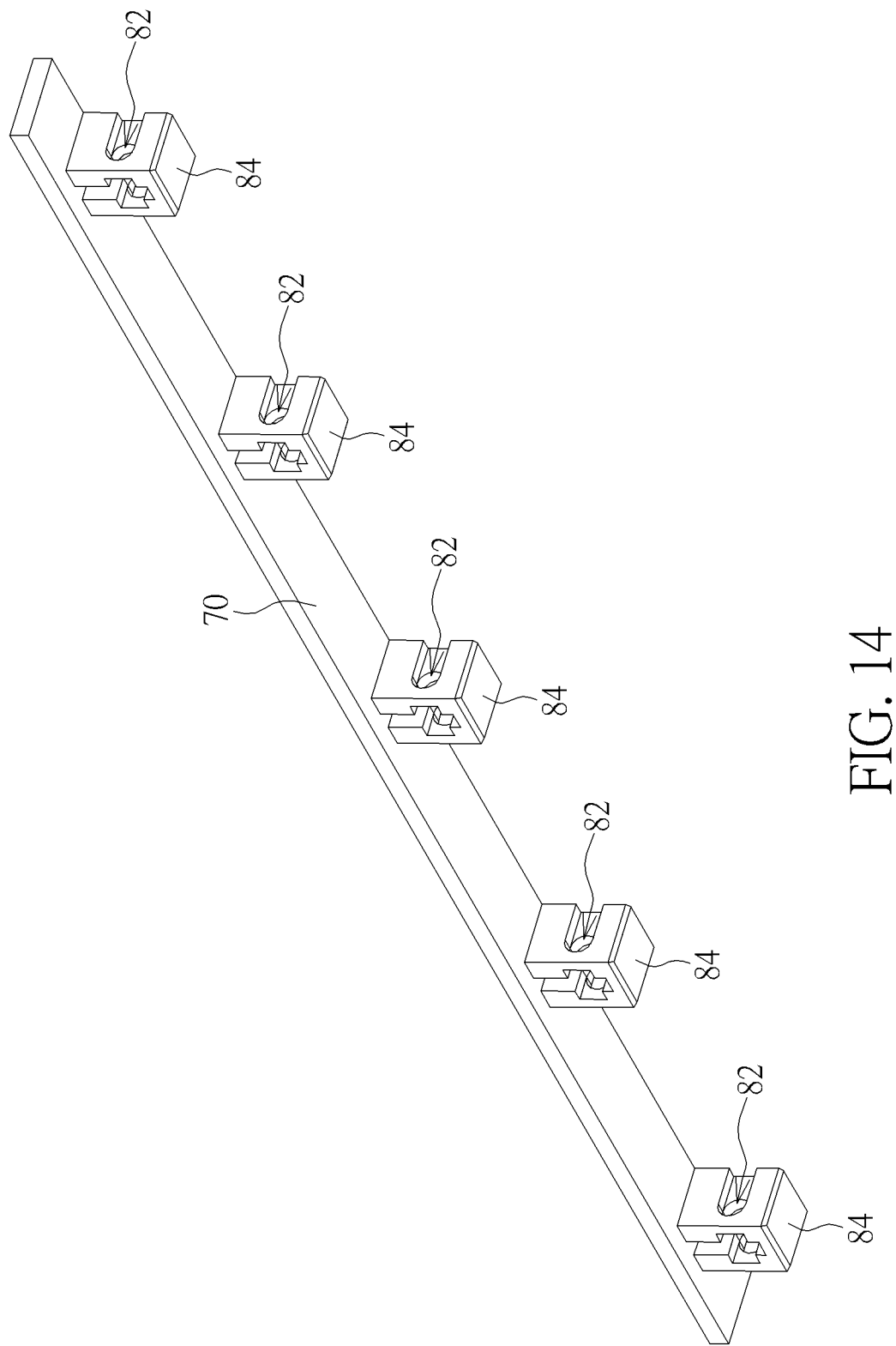
FIG. 14 is a diagram of a covering component according to the second embodiment of the present disclosure.
Figure 15:
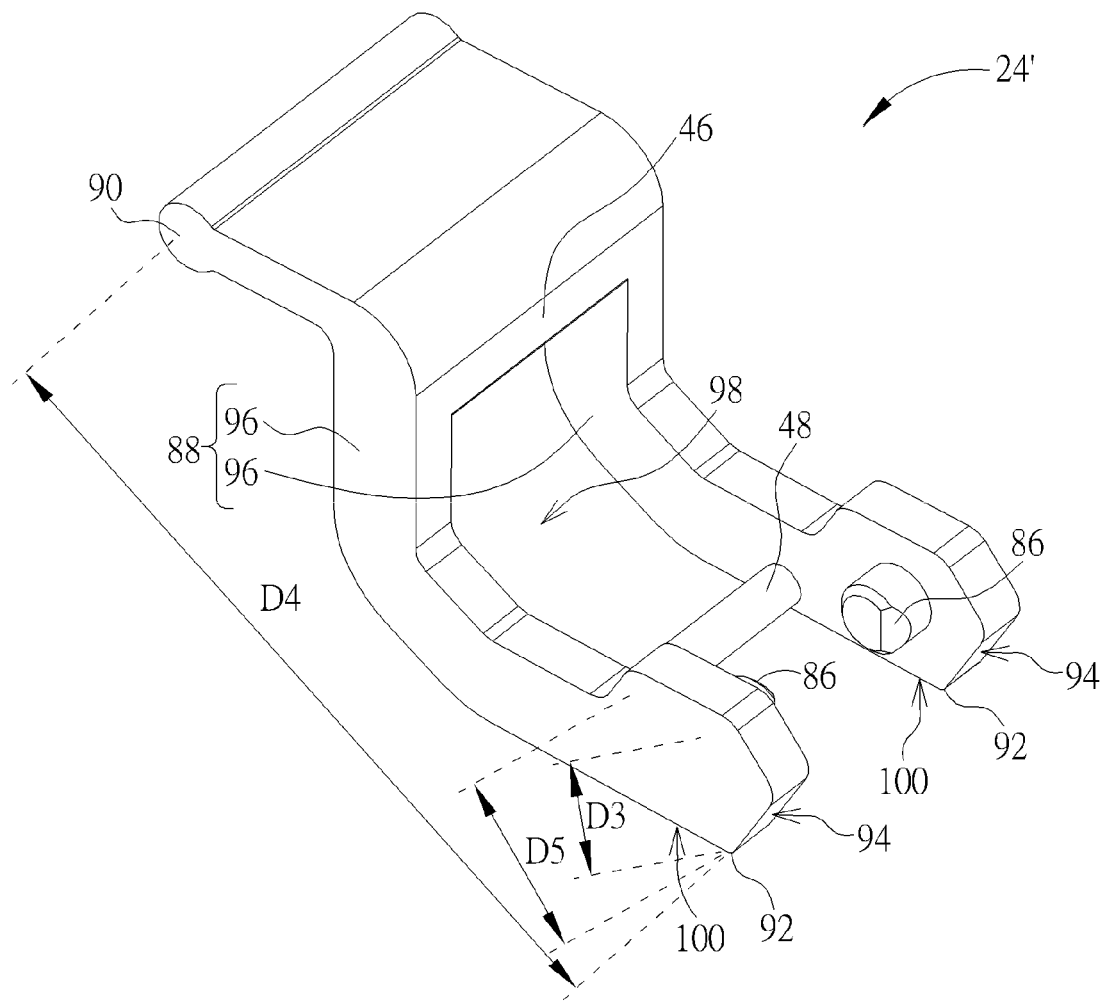
FIG. 15 is a diagram of the latch according to the second embodiment of the present disclosure.

Please refer to FIG. 10 to FIG. 15. FIG. 12 is a diagram of the base 22' according to the second embodiment of the present disclosure. FIG. 13 is a diagram of the sliding component 68 according to the second embodiment of the present disclosure. FIG. 14 is a diagram of the covering component 70 according to the second embodiment of the present disclosure. FIG. 15 is a diagram of the latch 24' according to the second embodiment of the present disclosure. The constraining shaft 72 includes the body 60 and the engaging portion 62. The engaging portion 62 is disposed on an end of the body 60 to engage with the pivoting hole 42 of the accommodating portion 34. Because the radial dimension S1 of the engaging portion 62 is greater than the radial dimension S2 of the body 60, the engaging portion 62 can be engaged with the pivoting hole 42 and the constraining shaft 72 is not separated from the accommodating portion 34. Structures of the constraining shaft 72 can be the same as the rotary shaft 58 illustrated in the first embodiment.

As shown in FIG. 12, the base 22' includes the connecting portion 28, the sliding slot structure 30, the accommodating portion 34 and a sliding shaft 74. The sliding shaft 74 is disposed inside the accommodating portion 34. As shown in FIG. 13 and FIG. 14, the sliding component 68 includes an axle hole structure 76. The sliding component 68 is slidably disposed on the sliding shaft 74 via the axle hole structure 76 to be movably disposed inside the accommodating portion 34. The sliding component 68 further includes a fixing hole 78 and a striped hole 80. The fixing hole 78 is formed adjacent by the axle hole structure 76, and the striped hole 80 is formed on a position distant from the axle hole structure 76. The covering component 70 includes a piercing hole 82 and a constraining surface 84. The constraining shaft 72 pierces through the pivoting hole 42 of the base 22', the striped hole 80 of the sliding component 68, and piercing hole 82 of the covering component 70, so that the covering component 70 can be stably disposed on the base 22'. Besides, the resilient component 26' preferably can be a compressive spring disposed on an outer wall of the axle hole structure 76. Two ends of the resilient component 26' respectively contact against a bottom 681 of the sliding component 68 and the constraining surface 84 of the covering component 70. The striped hole 80 is a sunken slot with long-axis, a length of the striped hole 80 is greater than dimensions of the constraining shaft 72, and the sliding component 68 can move relative to the base 22' along the long-axis direction of the striped hole 80.

As shown in FIG. 15, the latch 24' includes the pressing portion 46, the pushing portion 48, an axle structure 86, a bridging portion 88, a handle 90, a rotatable fulcrum portion 92 and a stopping surface structure 94. The axle structure 86 is disposed on the bridging portion 88 and adjacent to the pushing portion 48. The axle structure 86 rotatably inserts into the fixing hole 78, and the latch 24' can rotate relative to the sliding component 68 to pivot inside the accommodating portion 34. Two ends of the bridging portion 88 are respectively connected to the pushing portion 48 and the pressing portion 46. The bridging portion 88 includes two ribs 96. An end of each rib 96 stretches from the pressing portion 46, and the axle structure 86 is disposed on the opposite ends of the ribs 96. The pushing portion 48 of the second embodiment can be a pillar structure disposed between the two ribs 96. The latch 24' can have a hollow zone 98 formed between the pressing portion 46, the pushing portion 48 and the bridging portion 88.

The handle 90 is disposed on an end of the pressing portion 46 opposite to the pushing portion 48. The rotatable fulcrum portion 92 can be a corner protrusion formed between two surface structures of the rib 96, and the foresaid surface structures respectively are the stopping surface structure 94 and a contacting surface structure 100. The stopping surface structure 94 is connected to the contacting surface structure 100, and a border between the stopping surface structure 94 and the contacting surface structure 100 can be the corner protrusion of the rotatable fulcrum portion 92. Further, a distance D3 between the rotatable fulcrum portion 92 and the axle structure 86 is smaller than a distance D4 between the rotatable fulcrum portion 92 and the handle 90, so the resilient recovering force of the resilient component 26' can drive the pressing portion 46 to press the expansion card module 16. A distance D5 between the rotatable fulcrum portion 92 and the pushing portion 48 is smaller than the distance D4 between the rotatable fulcrum portion 92 and the handle 90, and the user can manually drive the latch 24' to rotate relative to the base 22' in an effort-saving manner so as to lift height of the expansion card module 16 by the pushing portion 48.

Figure 16:
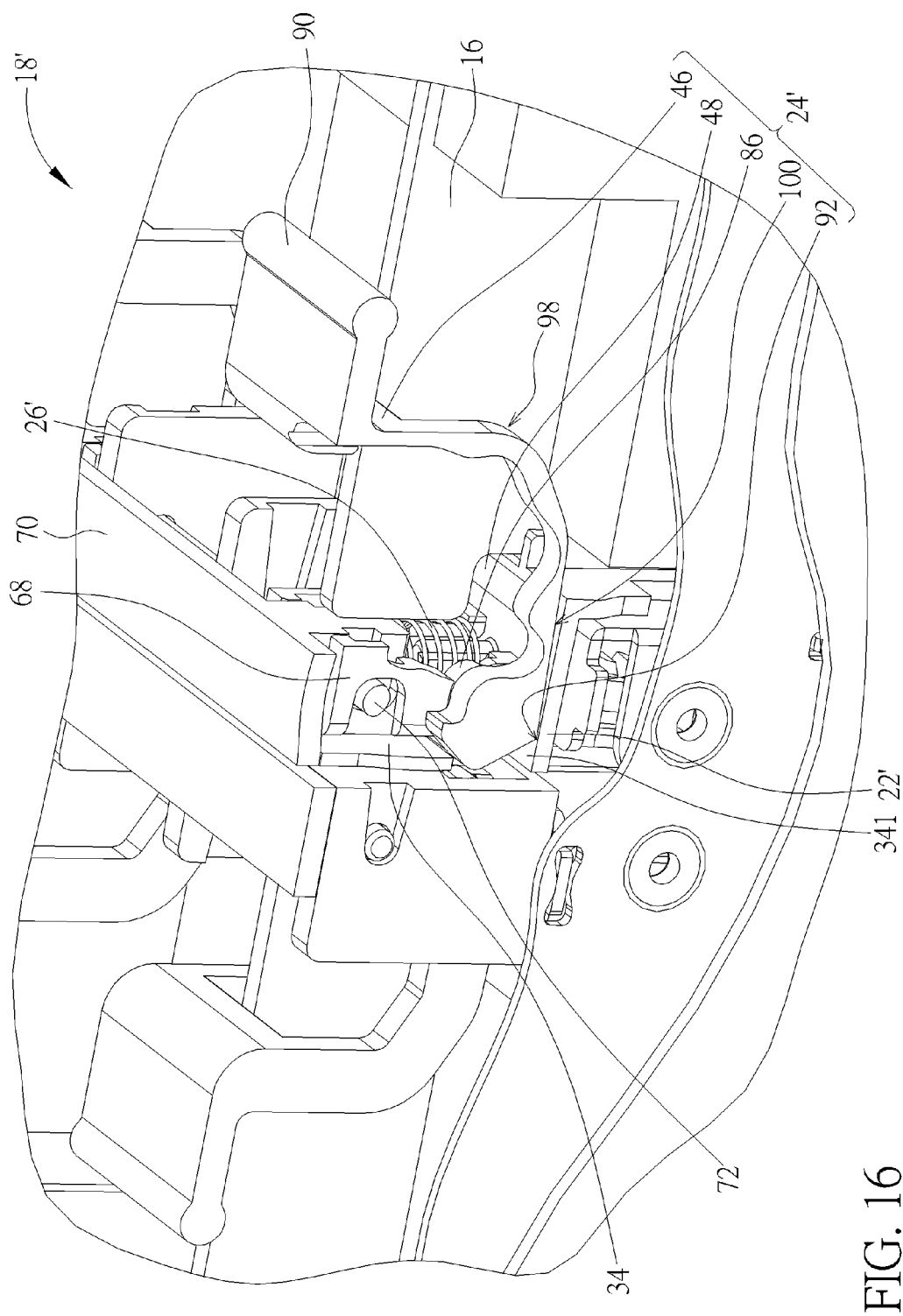
FIG. 16 to FIG. 19 respectively are diagrams of the fixing mechanism in different operation modes according to the second embodiment of the present disclosure.

Please refer to FIG. 16 to FIG. 19. FIG. 16 to FIG. 19 respectively are diagrams of the fixing mechanism 18' in different operation modes according to the second embodiment of the present disclosure. As shown in FIG. 16, the latch 24' is switched to the first position, the pressing portion 46 presses the upper side of the expansion card module 16, the pushing portion 48 contacts against the lower side of the expansion card module 16, apart of the expansion card module 16 passes through the hollow zone 98, and the expansion card module 16 is buckled by the latch 24' to stably assemble with the circuit board 14 . Furthermore, the contacting surface structure 100 does not contact the base 22' and only the rotatable fulcrum portion 92 contacts against the contacting surface 341 of the accommodating portion 34 since the latch 24' is switched to the first position. In the meantime, the sliding component 68 does not contact the contacting surface 341 but is suspended inside the accommodating portion 34 by the resilient component 26'. Due to compression of the resilient component 26', the resilient recovering force of the resilient component 26' downwardly presses the sliding component 68, and the sliding component 68 can drive the latch 24' to continuously press the expansion card module 16 via the axle structure 86, to avoid the expansion card module 16 from release or vibration.

Figure 17:
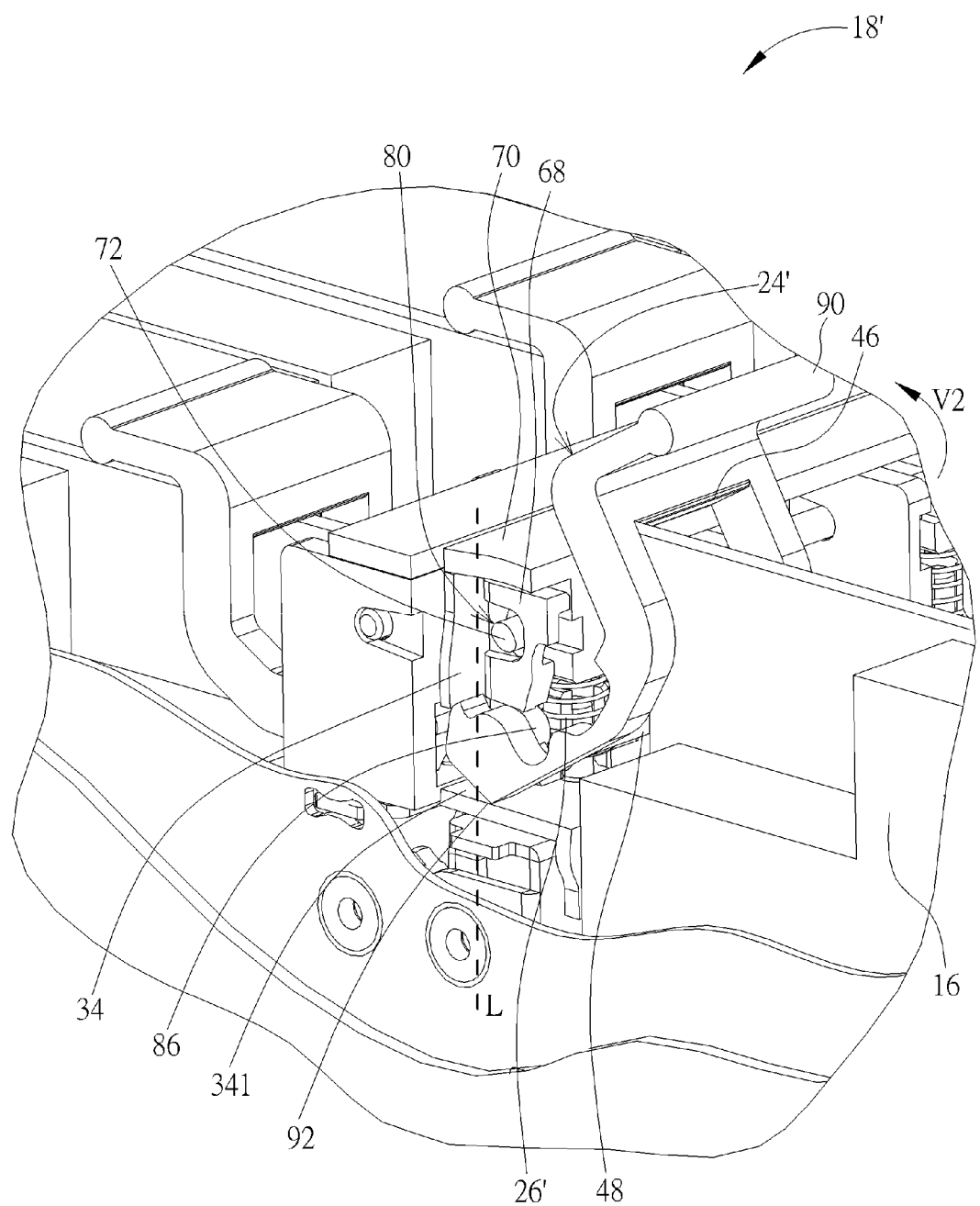

As shown in FIG. 17, the external force is applied to the handle 90 to rotate the latch 24' at the counterclockwise direction V2 for disassembly of the expansion card module 16. Because of the distance D4 greater than the distance D5, the expansion card module 16 can be lifted by the pushing portion 48 in the effort-saving manner;

meanwhile, the counterclockwise rotation of the latch 24' lifts the sliding component 68 by relative movement between the striped hole 80 and the constraining shaft 72, and the resilient component 26' is compressed to store the resilient recovering force. When the latch 24' rotates to make a connective line L between the rotatable fulcrum portion 92 and the axle structure 86 substantially parallel to a deformed direction of the resilient component 26', a torque generated by the resilient recovering force equals zero, and the resilient recovering force of the resilient component 26' can be adapted to rotate the latch 24' at the counterclockwise direction V2 since the latch 24' is slightly rotated at the counterclockwise direction V2, which means the latch 24' can be automatically switched to the second position shown in FIG. 18 without application of the external force by the user.

Figure 18:
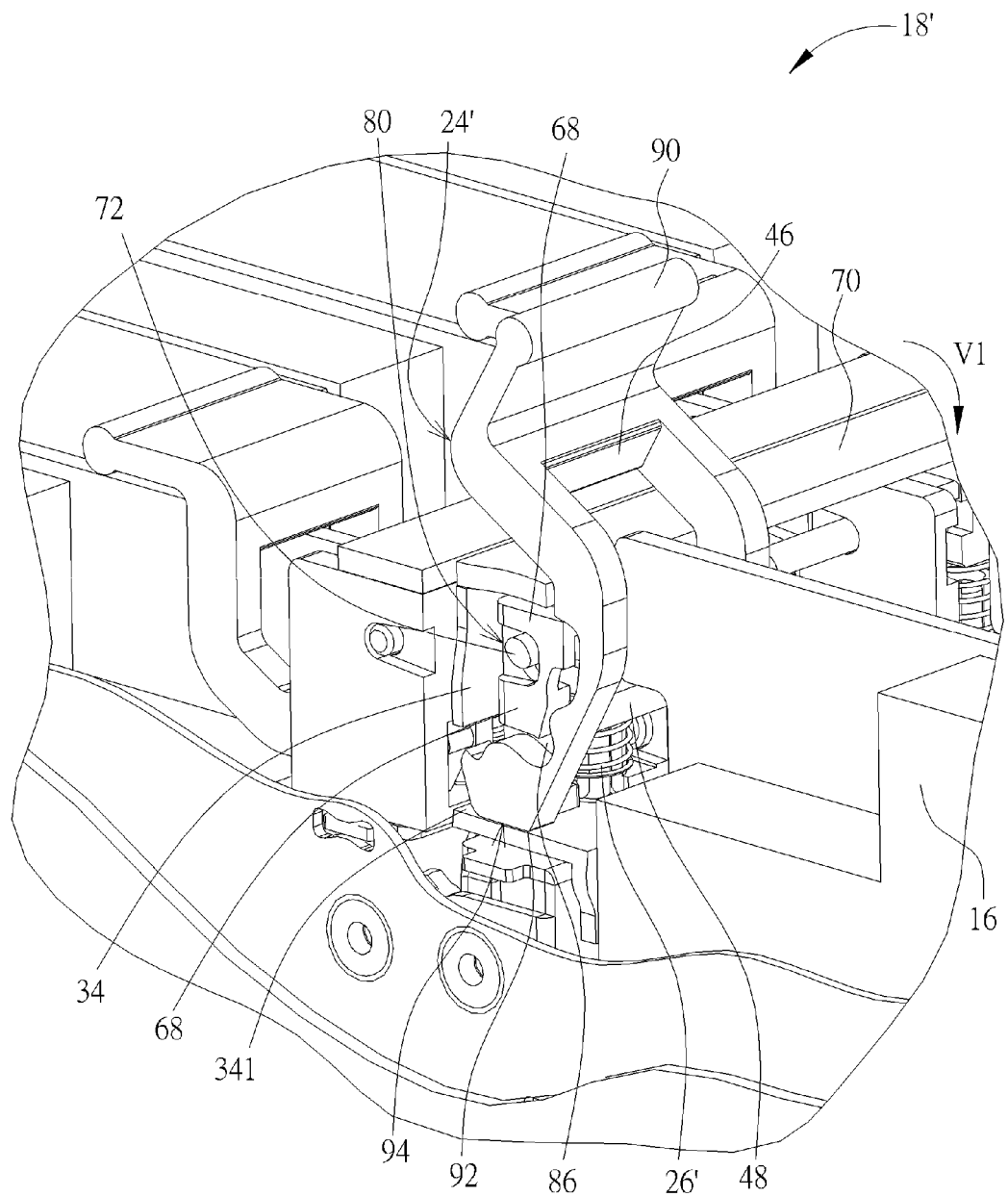
Figure 19:
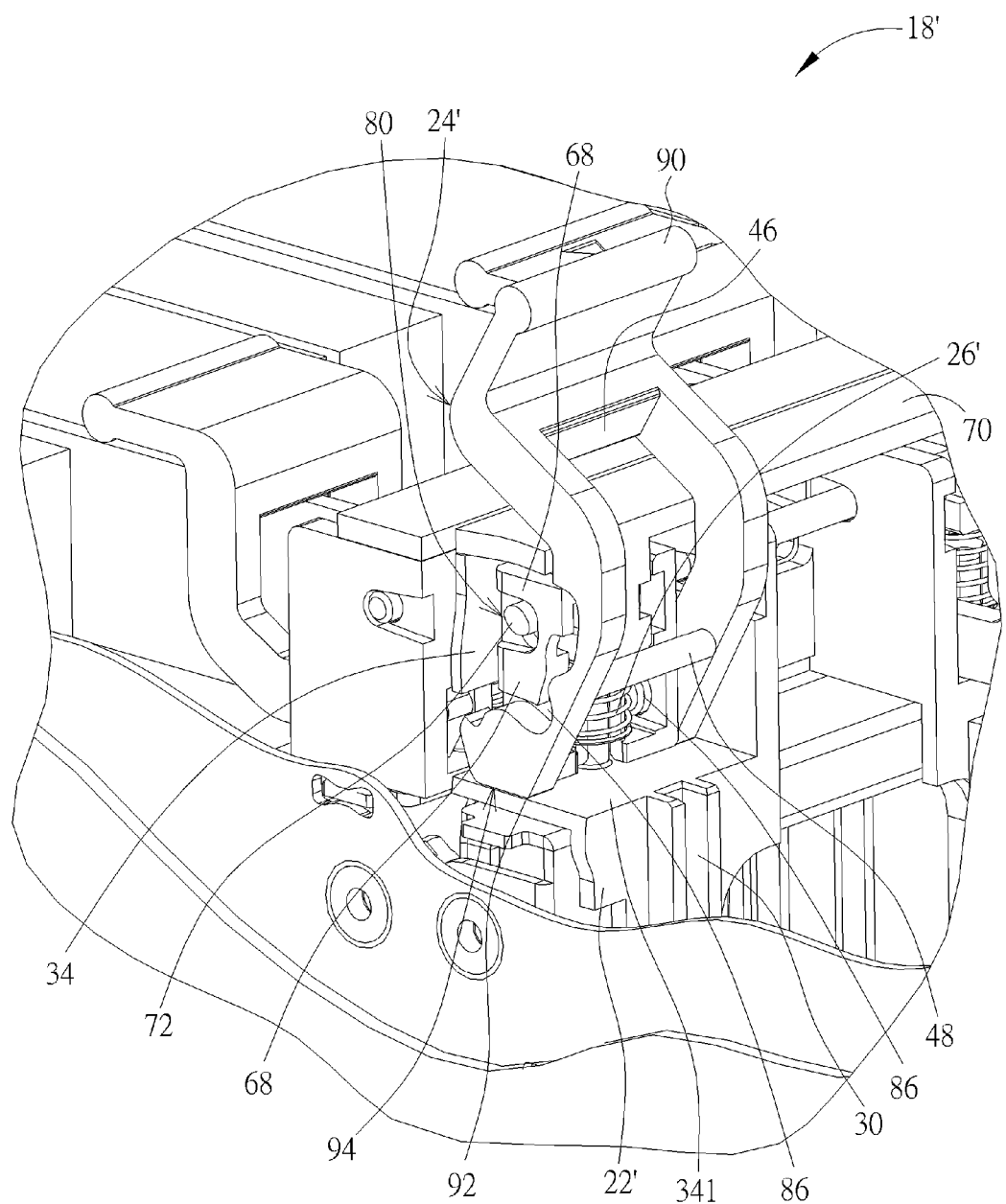

As shown in FIG. 18 and FIG. 19, the expansion card module 16 is upwardly moved along the sliding slot structure 30 to be released from constraint of the fixing mechanism 18'. When the latch 24' is switched to the second position, the resilient recovering force of the resilient component 26' downwardly presses the sliding component 68, the sliding component 68 drives the stopping surface structure 94 to contact against the contacting surface 341 to ensure that the latch 24' can keep at an open mode (such as being stayed at the second position) . For assembly of the expansion card module 16, the expansion card module 16 can downwardly slide along the sliding slot structure 30 to contact against the pushing portion 48. Then, the handle 90 is pushed at the clockwise direction V1, and the latch 24' can be rotated at the clockwise direction V1 as along as the external force is greater than the torque generated by the resilient component 26', as position shown in FIG. 18 varied toward position shown in FIG. 17. Since the connective line L between the rotatable fulcrum portion 92 and the axle structure 86 is substantially parallel to the deformed direction of the resilient component 26', the resilient component 26' can automatically rotate the latch 24' at the clockwise direction V1 as along as the latch 24' is slightly rotated at the clockwise direction V1, which means the latch 24' can be switched to the first position shown in FIG. 16 without application of the external force by the user.

The present disclosure provides the fixing mechanism capable of easily assembling and disassembling the expansion card module and the electronic device having the foresaid fixing mechanism. In the first embodiment, the latch of the fixing mechanism utilizes the pressing portion, the resilient portion and the pushing portion to buckle the upper side, the lateral side and the lower side of the expansion card module, and the clamping portion of the latch inserts into the clamping slot of the expansion card module for preferred constraint stability. The latch is driven by the resilient component (which is the elastic piece structure) to keep at the open mode. Since the latch is rotated to release constraint applied to the expansion card module, the pushing portion further can simultaneously upward push the expansion card module, and the expansion card module which is selected to disassemble is lifted higher than another adjacent expansion card module. The selected expansion card module is conveniently removed by the user without accidental collision. In the second embodiment, the latch utilizes the pressing portion and the pushing portion to buckle the upper side and the lower side of the expansion card module. A part of the expansion card module may pass through the hollow zone of the latch for complete constraint. The latch pivots inside the accommodating portion via the sliding component. The resilient component (which is the compressive spring) can drive the sliding component to move relative to the accommodating portion upwardly and downwardly, and the rotatable fulcrum portion is formed on the border between the stopping surface structure and the contacting surface structure of the bridging portion. When the latch rotates to a predetermined angle, the resilient component utilizes the rotatable fulcrum portion to be the corner protrusion and the latch can automatically rotate to the predetermined position (such as the first position or the second position) , so as to provide the effort-saving function.

The present disclosure can utilize the elastic-piece resilient component to movably contact against the pushing portion, or utilize the resilient component with the compressive spring form to connect with the latch by the sliding component, so that the resilient component can directly or indirectly actuate the latch. The pressing portion of the latch can resiliently press the expansion card module to absorb vibration generated by the expansion card module effectively and to prevent the foresaid vibration from being transmitted to inner components of the electronic device. Comparing to the prior art, the fixing mechanism capable of easily assembling and disassembling the expansion card module and the electronic device having the foresaid fixing mechanism of the present disclosure has advantages of simple structure, easy assembly/disassembly and convenient operation.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A fixing mechanism capable of assembling and disassembling an expansion card module, comprising:
    a base, comprising:
        a connecting portion;
        a sliding slot structure disposed on the connecting portion, the expansion card module being adapted to slidably move relative to the connecting portion by the sliding slot structure;
        an accommodating portion disposed on an end of the connecting portion;
    a latch pivoting inside the accommodating portion to rotatably switch between a first position and a second position, the latch comprising:
        a pressing portion for pressing a side of the expansion card module since the latch is switched to the first position; and
        a pushing portion bending from the pressing portion, the pushing portion being adapted to push an opposite side of the expansion card module since the latch is switched from the first position to the second position, so as to move the expansion card module relative to the sliding slot structure; and
    a resilient component located inside the accommodating portion to actuate the latch, the resilient component driving the latch to rotate and to stay at the second position.

2. The fixing mechanism of claim 1, wherein the connecting portion comprises a first surface and a second surface opposite to each other, the sliding slot structure is disposed on the first surface, the base further comprises at least one hook disposed on the second surface, the connecting portion is fixed on a bracket by the hook.

3. The fixing mechanism of claim 1, wherein the latch further comprises a resilient portion, two ends of the resilient portion are respectively connected to the pressing portion and the pushing portion in a resilient deformable manner.

4. The fixing mechanism of claim 3, wherein the latch further comprises a contacting portion stretching from the pushing portion to contact against the resilient portion and to constrain deformation of the resilient portion.

5. The fixing mechanism of claim 1, wherein the latch further comprises a clamping portion disposed on the pressing portion, the clamping portion inserts into a clamping slot on the expansion card module since the pressing portion presses the expansion card module.

6. The fixing mechanism of claim 1, wherein the resilient component is an elastic piece structure with a first end and a second end opposite to each other, the first end is located inside the accommodating portion, and the second end movably contacts against the pushing portion.

7. The fixing mechanism of claim 1, wherein the accommodating portion comprises a pivoting hole, the latch further comprises an axle structure adjacent to the pushing portion, the fixing mechanism further comprises a rotary shaft piercing through the pivoting hole and the axle structure.

8. The fixing mechanism of claim 7, wherein the rotary shaft comprises a body and an engaging portion, the engaging portion is disposed on an end of the body and engaged with the pivoting hole, a radial dimension of the engaging portion is greater than a radial dimension of the body.

9. The fixing mechanism of claim 7, wherein the latch further comprises a handle disposed on an end of the pressing portion opposite to the pushing portion.

10. The fixing mechanism of claim 9, wherein a distance between the handle and the axle structure is greater than a distance between the pushing portion and the axle structure.

11. The fixing mechanism of claim 1, wherein the base further comprises a sliding shaft disposed inside the accommodating portion, the fixing mechanism further comprises a sliding component movably disposed inside the accommodating portion, an axle hole structure is formed on the sliding component, the sliding component is slidably disposed on the sliding shaft via the axle hole structure.

12. The fixing mechanism of claim 11, wherein a fixing hole is formed on the sliding component, the latch further comprises an axle structure adjacent to the pushing portion and rotatably inserting into the fixing hole.

13. The fixing mechanism of claim 11, wherein the resilient component is a compressive spring disposed on the axle hole structure.

14. The fixing mechanism of claim 11, further comprising:
    a covering component disposed on the base, two ends of the resilient component respectively contacting against the covering component and the sliding component.

15. The fixing mechanism of claim 14, further comprising:
    a constraining shaft piercing through the base, the sliding component and the covering component.

16. The fixing mechanism of claim 15, wherein the constraining shaft comprises a body and an engaging portion, the engaging portion is disposed on an end of the body and engaged with the base, a radial dimension of the engaging portion is greater than a radial dimension of the body.

17. The fixing mechanism of claim 11, wherein the latch further comprises a bridging portion, two ends of the bridging portion are respectively connected to the pushing portion and the pressing portion.

18. The fixing mechanism of claim 17, wherein the bridging portion comprises two ribs stretching from the pressing portion, the pushing portion is a pillar structure disposed between the two ribs.

19. The fixing mechanism of claim 11, wherein the latch further comprises a handle disposed on an end of the pressing portion opposite to the pushing portion.

20. The fixing mechanism of claim 19, wherein the latch further comprises a rotatable fulcrum portion, a distance between the rotatable fulcrum portion and the axle structure is smaller than the rotatable fulcrum portion and the handle, and a distance between the rotatable fulcrum portion and the pushing portion is smaller than a distance between the rotatable fulcrum portion and the handle.

21. The fixing mechanism of claim 20, wherein the rotatable fulcrum portion is a corner protrusion formed between two surface structures connected with each other.

22. The fixing mechanism of claim 20, wherein the latch further comprises a stopping surface structure connected with the rotatable fulcrum portion.

23. The fixing mechanism of claim 20, wherein the rotatable fulcrum portion contacts a contacting surface of the accommodating portion and the sliding component does not contact the contacting surface when the latch is switched to the first position.

24. The fixing mechanism of claim 12, wherein the stopping surface structure contacts a contacting surface of the accommodating portion since the latch is switched to the second position.

25. An electronic device capable of assembling and disassembling an expansion card module, comprising:
   a bracket;
   a circuit board disposed on a bottom of the bracket, the circuit board having an inserting slot, the expansion card module inserting into the inserting slot to electrically connect to the circuit board; and
   a fixing mechanism disposed on the bracket for assembly and disassembly of the expansion card module, the fixing mechanism comprising:
      a base, comprising:
         a connecting portion;
         a sliding slot structure disposed on the connecting portion, the expansion card module being adapted to slidably move relative to the connecting portion by the sliding slot structure;
         an accommodating portion disposed on an end of the connecting portion;
      a latch pivoting inside the accommodating portion to rotatably switch between a first position and a second position, the latch comprising:
         a pressing portion for pressing a side of the expansion card module since the latch is switched to the first position; and
         a pushing portion bending from the pressing portion, the pushing portion being adapted to push an opposite side of the expansion card module since the latch is switched from the first position to the second position, so as to move the expansion card module relative to the sliding slot structure; and
      a resilient component located inside the accommodating portion to actuate the latch, the resilient component driving the latch to rotate and to stay at the second position.

26. The electronic device of claim 25, wherein the connecting portion comprises a first surface and a second surface opposite to each other, the sliding slot structure is disposed on the first surface, the base further comprises at least one hook disposed on the second surface, the connecting portion is fixed on the bracket by the hook.

27. The electronic device of claim 25, wherein the latch further comprises a resilient portion, two ends of the resilient portion are respectively connected to the pressing portion and the pushing portion in a resilient deformable manner, the latch further comprises a contacting portion stretching from the pushing portion to contact against the resilient portion and to constrain deformation of the resilient portion, the latch further comprises a clamping portion disposed on the pressing portion, the clamping portion inserts into a clamping slot on the expansion card module since the pressing portion presses the expansion card module, the resilient component is an elastic piece structure with a first end and a second end opposite to each other, the first end is disposed on the bracket and located inside the accommodating portion, the second end movably contacts against the pushing portion, the accommodating portion comprises a pivoting hole, the latch further comprises an axle structure adjacent to the pushing portion, the fixing mechanism further comprises a rotary shaft piercing through the pivoting hole and the axle structure, the rotary shaft comprises a body and an engaging portion, the engaging portion is disposed on an end of the body and engaged with the pivoting hole, a radial dimension of the engaging portion is greater than a radial dimension of the body, the latch further comprises a handle disposed on an end of the pressing portion opposite to the pushing portion, a distance between the handle and the axle structure is greater than a distance between the pushing portion and the axle structure.

28. The electronic device of claim 25, wherein the base further comprises a sliding shaft disposed inside the accommodating portion, the fixing mechanism further comprises a sliding component movably disposed inside the accommodating portion, an axle hole structure is formed on the sliding component, the sliding component is slidably disposed on the sliding shaft via the axle hole structure, a fixing hole is formed on the sliding component, the latch further comprises an axle structure adjacent to the pushing portion and rotatably inserting into the fixing hole, the resilient component is a compressive spring disposed on the axle hole structure, the fixing mechanism further comprises a covering component disposed on the base, two ends of the resilient component respectively contact against the covering component and the sliding component, the fixing mechanism further comprises a constraining shaft piercing through the base, the sliding component and the covering component, the constraining shaft comprises a body and an engaging portion, the engaging portion is disposed on an end of the body and engaged with the base, a radial dimension of the engaging portion is greater than a radial dimension of the body, the latch further comprises a bridging portion, two ends of the bridging portion are respectively connected to the pushing portion and the pressing portion, the bridging portion comprises two ribs stretching from the pressing portion, the pushing portion is a pillar structure disposed between the two ribs, the latch further comprises a handle disposed on an end of the pressing portion opposite to the pushing portion, the latch further comprises a rotatable fulcrum portion, a distance between the rotatable fulcrum portion and the axle structure is smaller than the rotatable fulcrum portion and the handle, and a distance between the rotatable fulcrum portion and the pushing portion is smaller than a distance between the rotatable fulcrum portion and the handle, the rotatable fulcrum portion is a corner protrusion formed between two surface structures connected with each other, the latch further comprises a stopping surface structure connected with the rotatable fulcrum portion, the rotatable fulcrum portion contacts a contacting surface of the accommodating portion and the sliding component does not contact the contacting surface when the latch is switched to the first position, the stopping surface structure contacts the contacting surface of the accommodating portion since the latch is switched to the second position.

* * * * *